United States Patent
Fujisawa et al.

(10) Patent No.: US 7,365,830 B2
(45) Date of Patent: Apr. 29, 2008

(54) WAFER FLATNESS EVALUATION METHOD, WAFER FLATNESS EVALUATION APPARATUS CARRYING OUT THE EVALUATION METHOD, WAFER MANUFACTURING METHOD USING THE EVALUATION METHOD, WAFER QUALITY ASSURANCE METHOD USING THE EVALUATION METHOD, SEMICONDUCTOR DEVICE MANUFACTURING METHOD USING THE EVALUATION METHOD AND SEMICONDUCTOR DEVICE MANUFACTURING METHOD USING A WAFER EVALUATED BY THE EVALUATION METHOD

(75) Inventors: Tadahito Fujisawa, Tokyo (JP); Soichi Inoue, Yokohama (JP); Makoto Kobayashi, Nishishirakawa-gun (JP); Masashi Ichikawa, Nishishirakawa-gun (JP); Tsuneyuki Hagiwara, Tokyo (JP); Kenichi Kodama, Mito (JP)

(73) Assignees: Kabushiki Kaisha Toshiba, Tokyo (JP); Shin-Etsu Handotai Co., Ltd., Tokyo (JP); Nikon Corporation, Tokyo (JP)

( * ) Notice: Subject to any disclaimer, the term of this patent is extended or adjusted under 35 U.S.C. 154(b) by 28 days.

(21) Appl. No.: 11/710,410

(22) Filed: Feb. 26, 2007

(65) Prior Publication Data

US 2007/0177126 A1 Aug. 2, 2007

Related U.S. Application Data

(62) Division of application No. 10/739,275, filed on Dec. 19, 2003, now Pat. No. 7,230,680.

(30) Foreign Application Priority Data

Dec. 20, 2002 (JP) .............................. 2002-370502

(51) Int. Cl.
G03B 27/58 (2006.01)
G03B 27/32 (2006.01)
G03B 27/52 (2006.01)

(52) U.S. Cl. .............................. 355/77; 355/55; 355/72

(58) Field of Classification Search .................. 355/72, 355/53, 55, 77; 702/167; 438/689; 356/500
See application file for complete search history.

(56) References Cited

U.S. PATENT DOCUMENTS

2002/0008864 A1 1/2002 Kondo
2003/0023402 A1 1/2003 Kobayashi et al.

FOREIGN PATENT DOCUMENTS

JP 2000 146569 5/2000
WO WO 02/41380 A1 11/2001

OTHER PUBLICATIONS

Fujisawa, T. et al. "Analysis of Wafer Flatness for CD Control in Photolithography," Optical Microlithography XV, Proceedings of SPIE, vol. 4691, pp. 802-809 (Mar. 2002).

(Continued)

*Primary Examiner*—Peter B. Kim
(74) *Attorney, Agent, or Firm*—Finnegan, Henderson, Farabow, Garrett & Dunner, L.L.P.

(57) ABSTRACT

There is disclosed a wafer flatness evaluation method includes measuring front and rear surface shapes of a wafer. The wafer front surface measured is divided into sites. Then, a flatness calculating method is selected according to a position of the site to be evaluated and flatness in the wafer surface is acquired.

6 Claims, 24 Drawing Sheets
(4 of 24 Drawing Sheet(s) Filed in Color)

OTHER PUBLICATIONS

"Technical Programs for the Semiconductor and Flat Panel Display Equipment and Materials Industries," Semi Japan Silicon Wafer Workshop, pp. 101-106 (2001).

Fukuda, T., "JEITA Flatness Study IV and the Impact of Edge Roll-off on CMP," Advanced Wafer Geometry Task Force 2002 SEMICON/Europe, 23 pages, Apr. 17, 2002.

Office Action from State Intellectual Property Office of People's Republic of China dated Aug. 12, 2005, and English language translation of same.

F: Full Site

P: Partial Site

Observation of front surface with rear surface chucked (max=69nm, min=−47nm)
Observation of rear surface with front surface chucked (max=56nm, min=−39nm)

Wafer shape in free standing state

State where wafer rear surface is chucked on pin chuck

State where wafer is reversed and front surface is chucked

← Wafer rear surface flatness distribution corresponding to position of pins of pin chuck.
In this case, 33.3nm p-p ← Wafer deformation simulation result by FEM (predicted shape of wafer front surface).
In this case, 29nm p-p propagates to front surface ← Stress distribution.
In this case, almost all pins are contacted = Wafer surface coincides with holder ←Wafer rear surface flatness distribution corresponding to position of pins of pin chuck.
In this case, 133.2nm p-p ←Wafer deformation simulation result by FEM (predicted shape of wafer front surface).
In this case, 109.8nm p-p propagates to front surface ←Stress distribution.
In this case, 164 pins among 225 pins are contacted

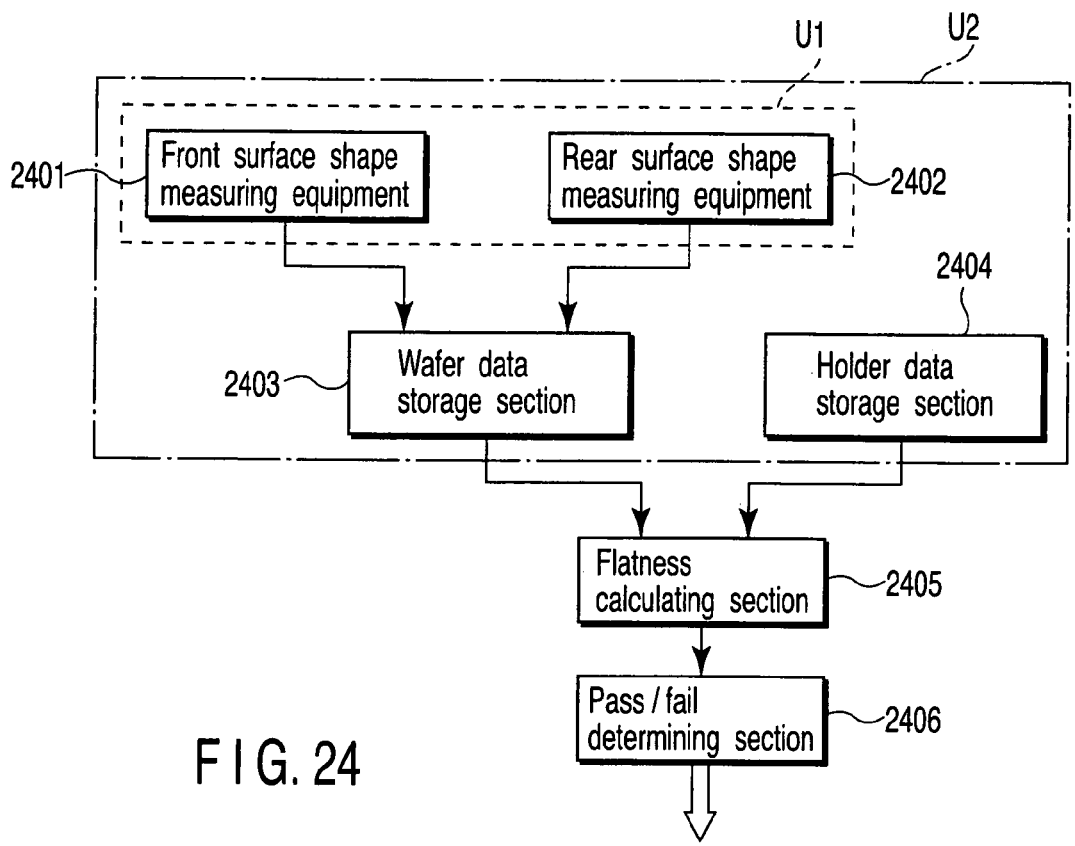
F I G. 24
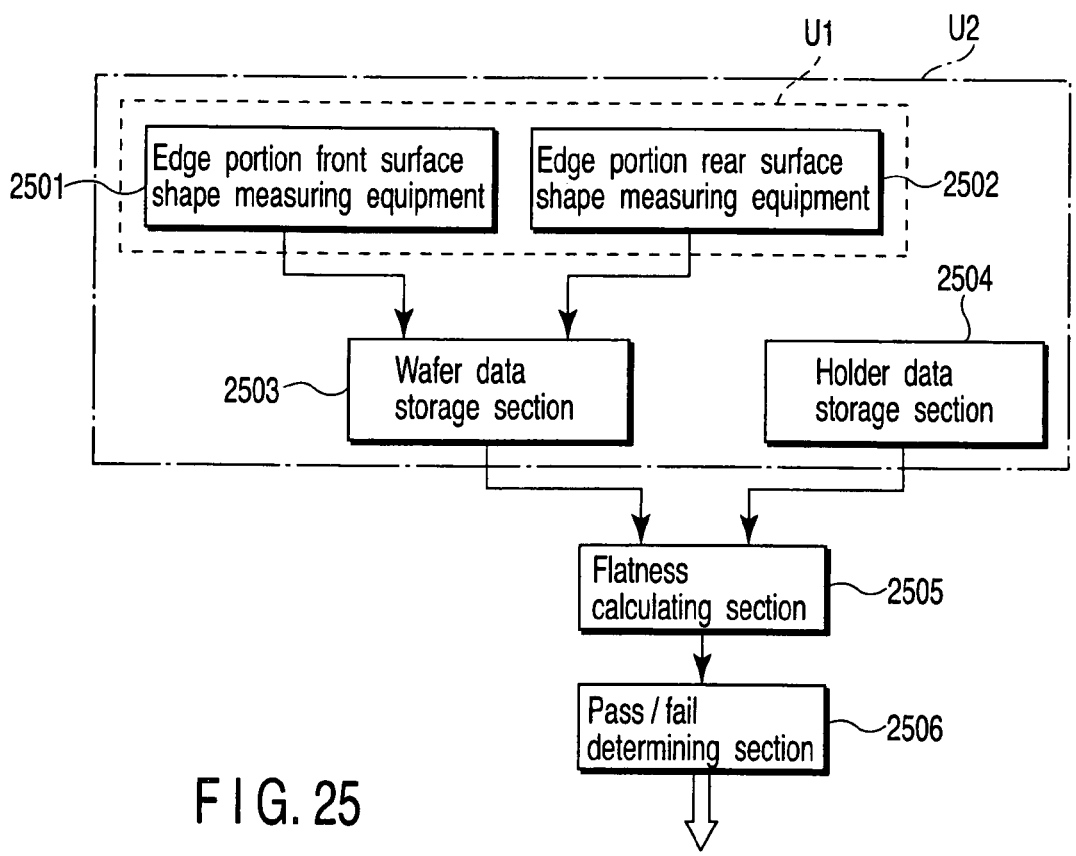
F I G. 25

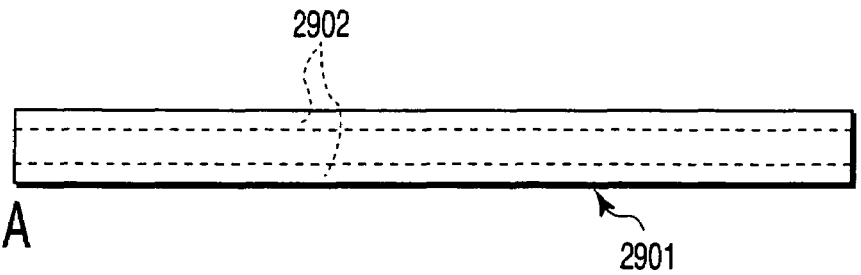
FIG. 29A
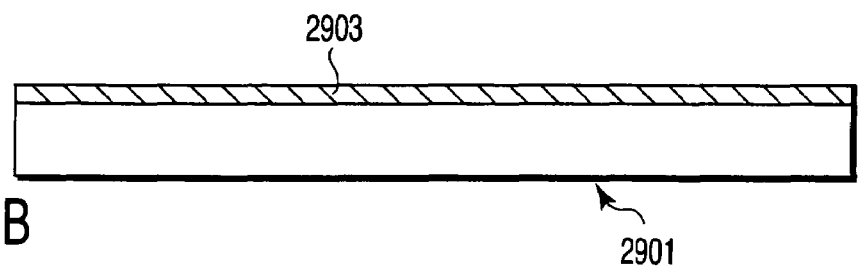
FIG. 29B
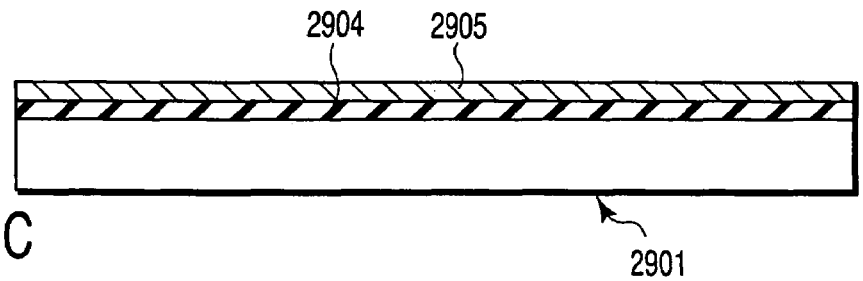
FIG. 29C
| Edge Exclusion | Holder A | Holder B | · · · | Holder Y | Holder Z |
|---|---|---|---|---|---|
| 3mm | AAA | BBB | · · · | YYY | ZZZ |
| 2mm | AA | BB | · · · | YY | ZZ |
| 1mm | A | B | · · · | Y | Z |
(AAA, ZZZ and the like indicate assurance SFQR values after chucking)
Example of quality assurance sheet
FIG. 30

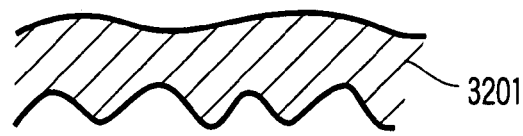
Convert to thickness variation
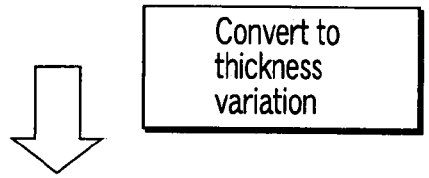
FIG. 32
(PRIOR ART)
FIG. 33A
(PRIOR ART)
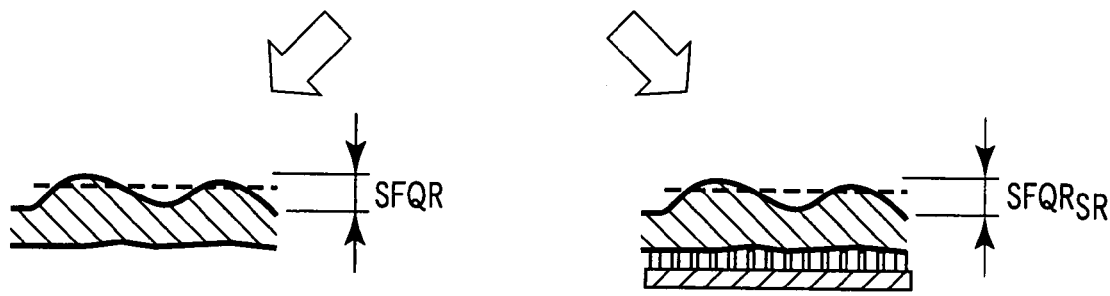
FIG. 33B
(PRIOR ART)
FIG. 33C
(PRIOR ART)
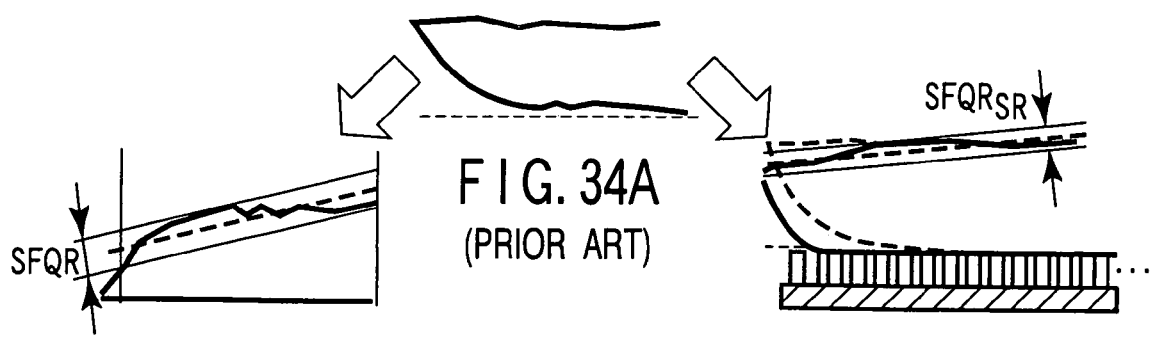
FIG. 34A
(PRIOR ART)
FIG. 34B
(PRIOR ART)
FIG. 34C
(PRIOR ART)

WAFER FLATNESS EVALUATION METHOD, WAFER FLATNESS EVALUATION APPARATUS CARRYING OUT THE EVALUATION METHOD, WAFER MANUFACTURING METHOD USING THE EVALUATION METHOD, WAFER QUALITY ASSURANCE METHOD USING THE EVALUATION METHOD, SEMICONDUCTOR DEVICE MANUFACTURING METHOD USING THE EVALUATION METHOD AND SEMICONDUCTOR DEVICE MANUFACTURING METHOD USING A WAFER EVALUATED BY THE EVALUATION METHOD

CROSS-REFERENCE TO RELATED APPLICATIONS

This application is a division of prior application Ser. No. 10/739,275, filed Dec. 19, 2003 now U.S. Pat. No. 7,230,680, and is based upon and claims priority from prior Japanese Patent Application No. 2002-370502, filed Dec. 20, 2002, the entire contents of both of which are incorporated herein by reference.

BACKGROUND OF THE INVENTION

1. Field of the Invention

This invention relates to a wafer flatness evaluation method, a wafer flatness evaluation apparatus which carries out the evaluation method, a wafer manufacturing method using the evaluation method, a wafer quality assurance method using the evaluation method, a semiconductor device manufacturing method using the evaluation method and a semiconductor device manufacturing method using a wafer evaluated by the evaluation method.

2. Description of the Related Art

The depth of focus gets closer to the limit as the pattern size of a semiconductor device is more miniaturized.

In the 100 nm generation, it is important to suppress a variation in the focus which is a CD (Critical Dimension: the size of a pattern transferred on a resist) variation factor as far as possible and reconsider each focus variation factor. As the focus variation factor, an influence by the wafer flatness is significant and it is required to further increase the flatness of a wafer.

In the conventional manufacturing method of a wafer represented by a silicon wafer, for example, a thin disk is cut out by slicing a single crystal ingot and sequentially subjected to various steps such as beveling, lapping, etching steps. Then, at least a main surface (one surface or both surfaces) of the wafer is polished to make a mirror-like surface and a mirror finished wafer (or PW) is formed. Elements are formed on the mirror finished wafer by use of an exposure device or the like to manufacture a device.

Wafers used in the device process are not limited to the mirror finished wafer and an epitaxial wafer having an epitaxial layer formed on a mirror finished wafer and an anneal wafer subjected to the heat treatment can be used in some cases. Further, a wafer having an added value attached to the mirror finished wafer, for example, an SOI wafer formed by laminating two mirror finished wafers with an oxide film disposed therebetween can be used in some cases (the above various types of wafers are generally referred to as wafers).

The wafers are formed by setting working processes (working process condition) to attain wafer quality corresponding to a specification of flatness or the like set in the device process based on the specification.

As shown in FIG. 32, as the conventional definition of the flatness of the wafer, SFQR (Site flatness quality requirements=total range of wafer topography relative to focal plane) which is derived based on the wafer flatness as viewed from the thickness distribution of the wafer, that is, the thickness distribution obtained when it is assumed that the wafer is completely chucked on an ideal plane is widely used. In FIG. 32, a reference symbol 3201 indicates the cross sectional shape of a site in the free standing state and a reference symbol 3202 indicates the cross sectional shape obtained when the site 3201 is completely chucked on the ideal plane.

The flatness required in the photolithography is flatness (which is referred to as "$SFQR_{SR}$" in this specification) which an exposure device, for example, a scanner senses in a state where the wafer is chucked on a wafer holder like the case of actual exposure as shown in FIGS. 33C and 34C from the viewpoint of a focus budget.

FIGS. 33A to 33C are cross sectional views showing the cross sectional shapes of a site (which is referred to as a "full site" in this specification) lying near the center of the wafer.

FIG. 33A shows the cross sectional shape of the full site in the free standing state and FIG. 33B shows the cross sectional shape when the full site is completely chucked on the ideal plane and the flatness SFQR thereof. Further, FIG. 33C shows the cross sectional shape when the full site is chucked on a pin-chuck type wafer holder and the flatness $SFQR_{SR}$ which the scanner senses.

When the pin-chuck type wafer holder is used, it is reported in a document 1 that the flatness SFQR of the full site becomes substantially the same as the flatness $SFQR_{SR}$ which the scanner senses.

FIGS. 34A to 34C are cross sectional views showing the cross sectional shapes of a site (which is referred to as a "partial site" in this specification) lying near the peripheral edge portion of the wafer.

FIG. 34A shows the cross sectional shape of the partial site in the free standing state and FIG. 34B shows the cross sectional shape when the partial site is completely chucked on the ideal plane and the flatness SFQR thereof. Further, FIG. 34C shows the cross sectional shape when the partial site is chucked on a pin-chuck type wafer holder and the flatness $SFQR_{SR}$ which the scanner senses.

As is understood by comparing FIGS. 34B and 34C, a large influence by the interaction between the edge shape of the wafer, the stage shape of the wafer holder and the structure of the chucking portion appears on the flatness of the partial site. Therefore, the flatness $SFQR_{SR}$ which the scanner senses becomes largely different from the result of the flatness SFQR when the shape of the wafer edge is derived and the site is completely chucked on the ideal plane. For example, it is reported in a document 2 that the flatness of the partial site is different from the flatness SFQR depending on the location of the wafer in which a hold groove in the outermost peripheral portion of the stage of the wafer holder is formed.

Further, in a document 3, the relation between the polishing pressure used at the CMP time and the distance from the wafer center, the wafer flatness after chucking and the edge roll-off is described.

Document 1: T. Fujisawa et al, "Analysis of Wafer Flatness for CD Control in Photolithography", Proc. SPIE 4691, pp. 802-809, 2002

Document 2: N. Poduje, "Edge Effect on Flatness for 130 nm Technology and beyond", Proc. SEMI Japan Silicon Wafer Workshop, pp. 101-106, 2001

Document 3: Tetsuo Fukuda, "JEITA Flatness Study IV and The Impact of Edge Roll-off on CMP", [ONLINE] 2002.04.17<, Advanced Wafer Geometry Task Force 2002 SEMICON/Europe (Munich), [Retrieved on Sep. 3, 2002], Internet<hyperlink symbology omitted>

As described above, in the conventional wafer flatness provided when the wafer is purchased, the flatness of a holder used at the exposure time and the interaction between the wafer and the holder are not taken into consideration. Therefore, particularly, the flatness of the partial site becomes different from the flatness which the scanner, that is, exposure device senses. As a result, a wafer which is evaluated to have high flatness by use of the conventional evaluation standard, for example, evaluation standard by SFQR cannot exhibit an expected performance when the wafer is actually chucked on the holder of the exposure device. Then, a focus variation amount exceeds the budget and it becomes difficult to suppress a CD variation within a sufficiently permissible range.

BRIEF SUMMARY OF THE INVENTION

A wafer flatness evaluation method according to a first aspect of the present invention comprises measuring front and rear surface shapes of a wafer; and dividing the front surface of the wafer into sites, selecting a flatness calculating method according to a position of the site to be evaluated and acquiring flatness in the wafer surface.

A wafer flatness evaluation apparatus according to a second aspect of the present invention comprises a measuring section which measures front and rear surface shapes of a wafer; and an acquiring section which divides the surface of the wafer into sites, selects a flatness calculating method according to a position of the site to be evaluated and acquires flatness in the wafer surface.

A wafer manufacturing method according to a third aspect of the present invention comprises acquiring a wafer from an ingot based on a working process condition set; measuring front and rear surface shapes of the acquired wafer; dividing the front surface of the wafer into sites, selecting a flatness calculating method according to a position of the site to be evaluated and acquiring flatness in the wafer surface; determining whether or not the acquired flatness of the wafer surface satisfies a requirement from a budget; fixing the set working process condition when the flatness of the wafer surface satisfies the requirement from the budget; and changing the set working process condition when the flatness of the wafer surface does not satisfy the requirement from the budget.

A wafer quality assurance method according to a fourth aspect of the present invention comprises measuring front and rear surface shapes of a wafer; dividing the front surface of the wafer into sites, selecting a method for calculating flatness according to a position of the site to be evaluated from a first method for calculating flatness based on thickness distribution acquired when it is assumed that the wafer is completely chucked on an ideal plane by use of the measurement values of the front and rear surface shapes of the wafer and a second method for calculating flatness based on surface shape distribution of the wafer acquired when the wafer is mounted on a wafer holder and acquiring flatness in the wafer surface from each of plural types of wafer holders; and assuring the flatness in the wafer for each of the plural types of wafer holders.

A semiconductor device manufacturing method according to a fifth aspect of the present invention comprises extracting a wafer which is being worked after a working process of a semiconductor device and before a lithography process; measuring front and rear surface shapes of the extracted wafer; dividing the front surface of the wafer into sites, selecting a flatness calculating method according to a position of the site to be evaluated and acquiring flatness in the wafer surface; determining whether the acquired flatness of the wafer surface maintains a value which satisfies a requirement from a budget or maintains a value which causes no problem; fixing working process conditions of the working process and lithography process when the flatness of the wafer surface maintains the satisfying value; and changing at least one of the working process conditions of the working process and lithography process when the flatness of the wafer surface does not maintain the satisfying value.

A semiconductor device manufacturing method according to a sixth aspect of the present invention comprises measuring front and rear surface shapes of a wafer; dividing the front surface of the wafer into sites, selecting a flatness calculating method according to a position the site to be evaluated and acquiring flatness in the wafer surface; determining whether the wafer is acceptable or not based on the acquired flatness; and manufacturing a semiconductor device by use of the wafer which is determined acceptable based on the above determination.

BRIEF DESCRIPTION OF THE SEVERAL VIEWS OF THE DRAWING

This patent or application file contains at least one drawing executed in color. Copies of this patent or patent application publication with color drawings will be provided by the Office upon request and payment of the necessary fee.

FIG. 24 is a block diagram showing a first example of a wafer flatness evaluation apparatus according to a fifth embodiment of this invention;

FIG. 25 is a block diagram showing a second example of the wafer flatness evaluation apparatus according to the fifth embodiment of this invention;

FIG. 29A is a cross sectional view showing an anneal wafer;

FIG. 29B is a cross sectional view showing an epitaxial wafer;

FIG. 29C is a cross sectional view showing an SOI wafer;

FIG. 30 is a view showing one example of a quality assurance sheet obtained by a wafer quality assurance method according to a seventh embodiment of this invention;

FIG. 32 is a cross sectional view showing the cross section of a site in the free standing state and the cross section when the site is completely chucked on an ideal plane;

FIGS. 33A, 33B and 33C are cross sectional views showing the cross sections of a full site; and FIGS. 34A, 34B and 34C are cross sectional views showing the cross sections of a partial site.

DETAILED DESCRIPTION OF THE INVENTION

There will now be described embodiments of this invention with reference to the accompanying drawings. In the explanation, common reference symbols are attached to like portions throughout the drawings.

First Embodiment

Prior to explanation of the first embodiment, definition of representative terms and a reference example used in this embodiment are explained with reference to FIGS. 1A to 1D and FIG. 2.

FIGS. 1A to 1D are plan views of a wafer.

Figure 1A:
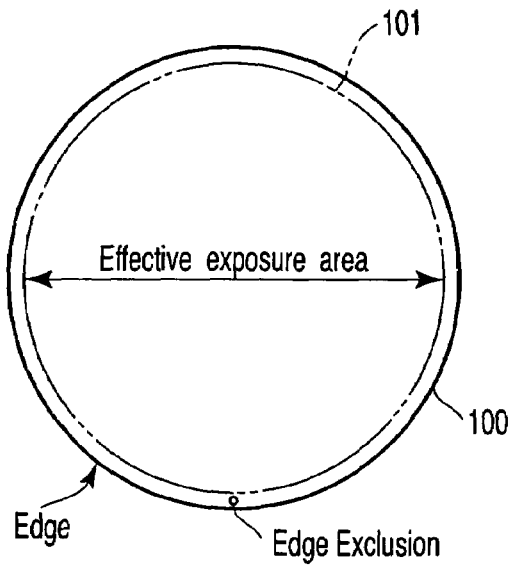
FIGS. 1A, 1B, 1C and 1D are plan views of a wafer.

It is desired to form an integrated circuit on the entire front surface of a wafer 100. However, actually, an effective integrated circuit is not formed on the entire surface of the wafer 100 and, as shown in FIG. 1A, an edge exclusion area with a width of approximately several mm from the edge of the wafer 100 is provided. An inside portion of the edge exclusion area is used as an effective exposure area and the effective integrated circuit is formed in the effective exposure area, for example. An outermost peripheral line for flatness evaluation set near the edge of the wafer 100 is set on a boundary line 101 between the edge exclusion area and the effective exposure area, for example.

Figure 1C:
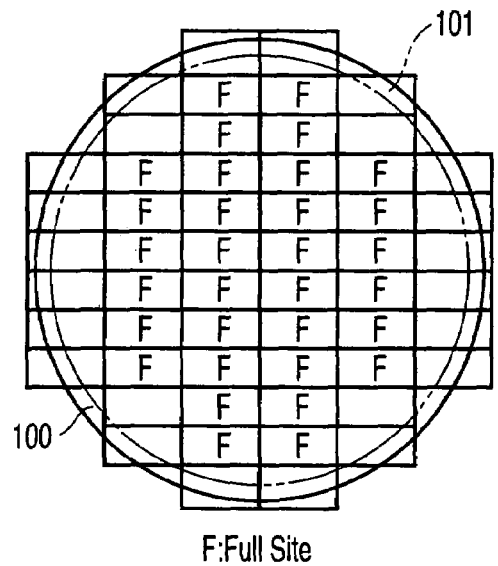
Figure 1B:
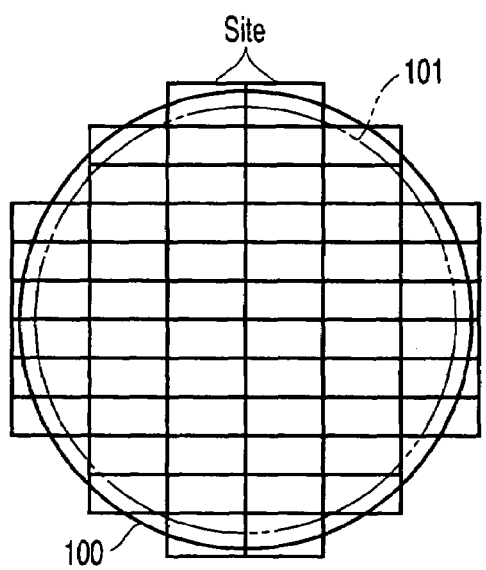
Figure 1D:
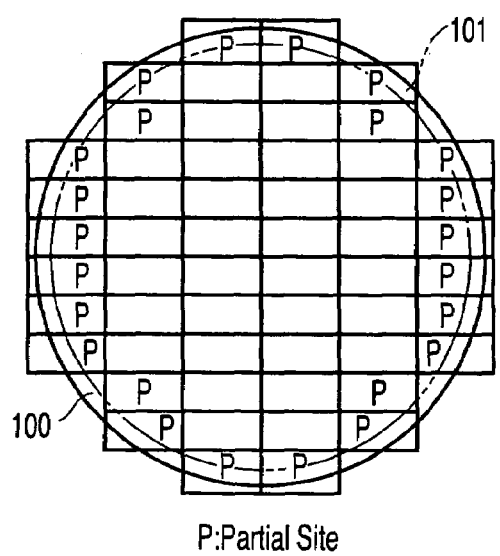

FIG. 1B shows sites divided on the front surface of the wafer 100. In FIG. 1B, a total of 56 sites are shown. The flatness of the wafer 100 is derived for each site, for example. Among the sites, the sites which lie near the central portion of the wafer 100, do not cross the boundary line 101 and have no cut-away portions as shown in FIG. 1C, for example, are referred to as full sites. Further, as shown in FIG. 1D, the sites which lie near the edge peripheral portion of the wafer 100, cross the boundary line 101 and have cut-away portions, for example, are referred to as partial sites. The sites able to divided on the front surface of the wafer 100 based on a size of an exposure area (or a shot).

Figure 2:
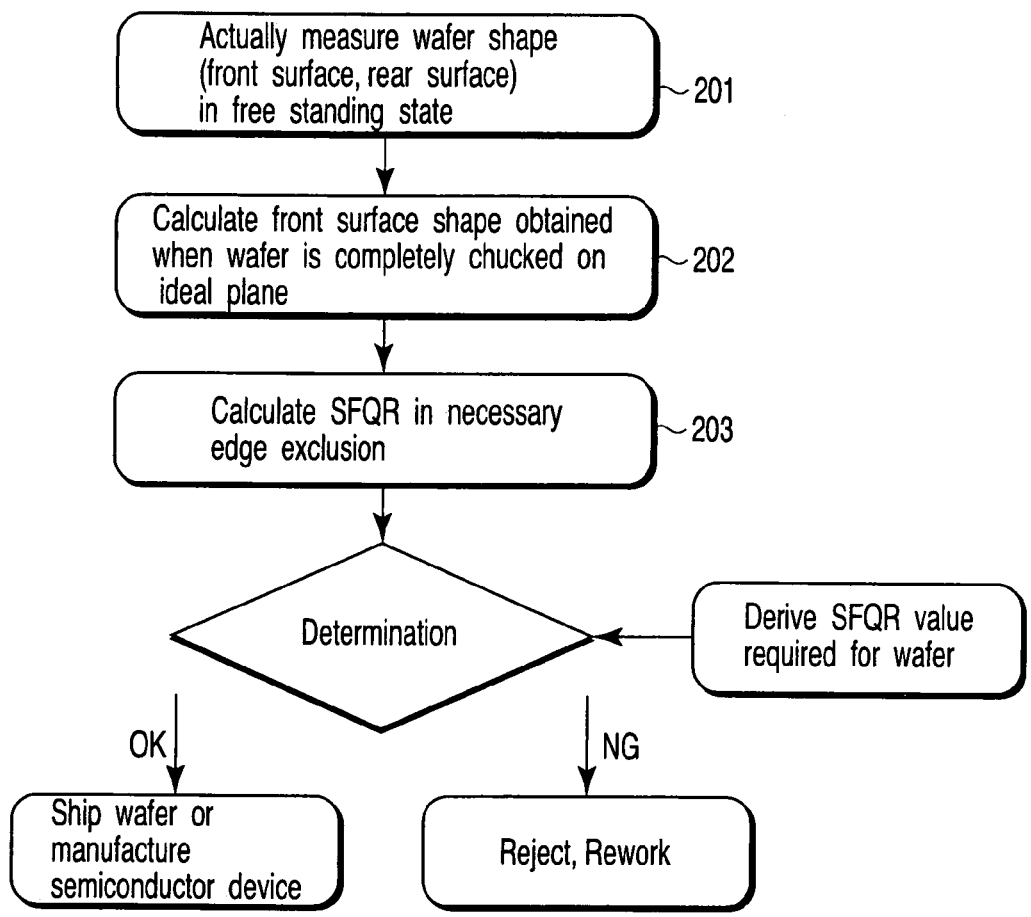
FIG. 2 is a flow diagram showing a wafer flatness evaluation method relating to a reference example.

FIG. 2 is a flow diagram showing a wafer flatness evaluation method relating to a reference example.

First, as shown in FIG. 2, a wafer shape in the free standing state is actually measured for the front and rear surfaces of the wafer (step 201).

Next, the front surface shape obtained when the actually measured wafer is completely chucked or fixedly held on an ideal plane is calculated (step 202).

Then, an ideal leveling process is performed for predetermined site size and SFQR is derived as "the maximum value (Max)−the minimum value (Min)" of the leveling residue (step 203). For calculation of SFQR, the same process as that for the full site having no cut-away portion is performed in the case of the partial site except that data for a portion outside the edge exclusion area is deleted.

Thus, in the reference example, the interaction between the edge shape of the wafer, the stage shape of the wafer holder and the structure of a chucking portion giving a large influence on the flatness is not taken into consideration at all in the partial site.

Therefore, inventors of this application considered that an evaluation criterion set by taking into consideration the front surface shape obtained when the wafer was chucked on the wafer holder of the same type as or the same specification as the exposure device used was necessary in order to make the wafer flatness evaluation suitable for the photolithography. An evaluation procedure according to a first embodiment of this invention is explained below.

Figure 3:
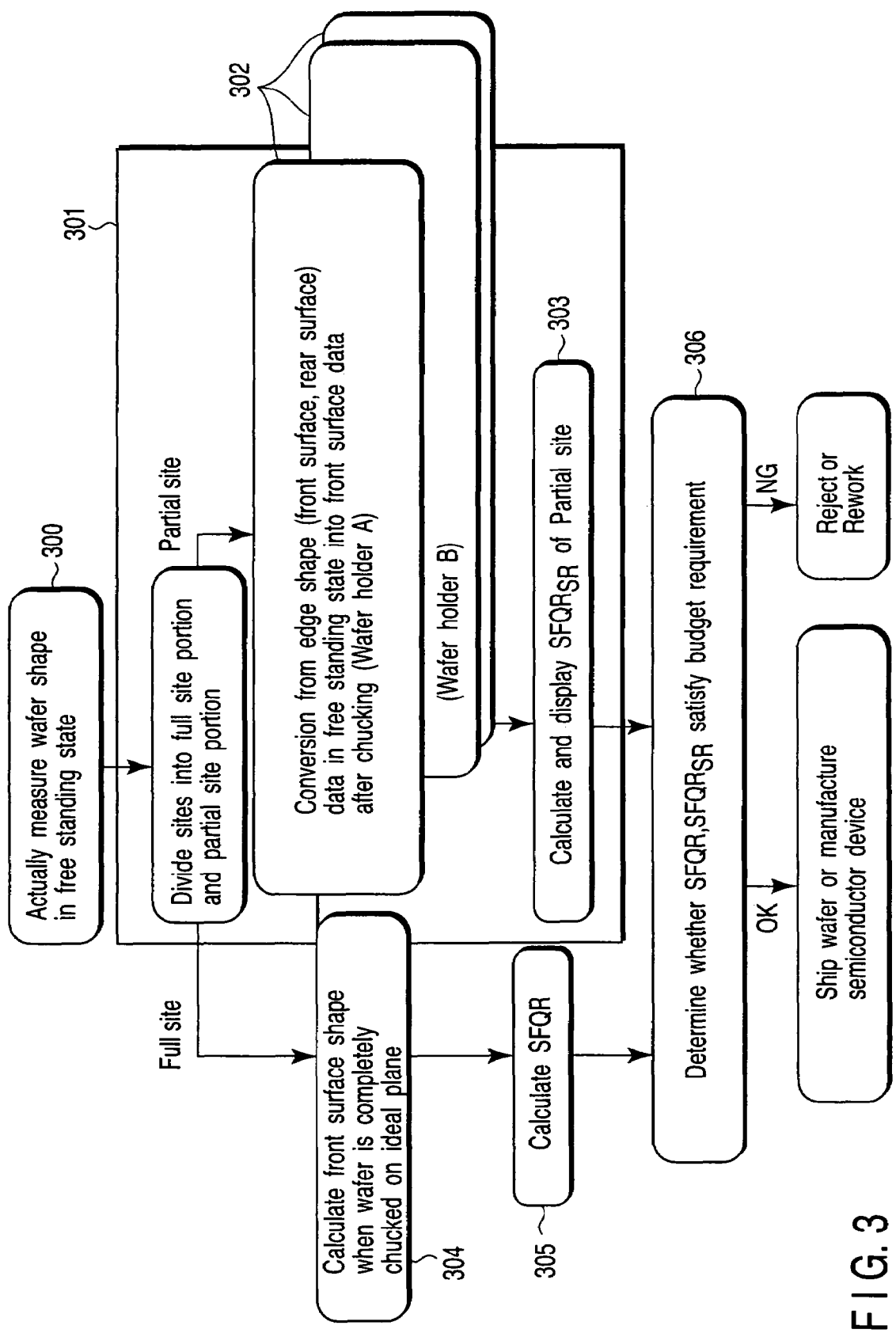
FIG. 3 is a flow diagram showing a wafer flatness evaluation method according to a first embodiment of this invention.

FIG. 3 is a flow diagram showing a wafer flatness evaluation method according to the first embodiment of this invention.

As shown in FIG. 3, the first embodiment is different from the reference example in that a step 301. A calculation method for calculating flatness in the wafer surface is selected in the step 301, that is, according to the position of a site to be evaluated. An example of classification of the position of the site to be evaluated is made such that the site to be evaluated is a partial site or full site.

In the site which is classified as the partial site, information items relating to the rear surface shape of the wafer edge portion, the stage shape of the wafer holder and the structure of the chucking portion are fetched and the front surface shape of the wafer edge portion after chucking is calculated (step 302).

Next, flatness $SFQR_{SR}$ which an exposure device, for example, a scanner senses is derived by use of the calculated front surface shape of the wafer edge portion (step 303). At this time, the number of types of wafer holders is not necessarily limited to one and if plural types of wafer holders are provided, $SFQR_{SR}$ is calculated for each holder and, for example, the worst one of the calculated flatness values $SFQR_{SR}$ may be used as the flatness $SFQR_{SR}$. Alternatively, each flatness $SFQR_{SR}$ may be issued for each holder.

Further, it is of course possible to derive the flatness $SFQR_{SR}$ not by calculation but by using the wafer front surface shape obtained by actually chucking the wafer on the wafer holder actually used or the wafer holder of the same type and making the actual measurement.

In the site which is classified as the full site, the front surface shape calculation method used when the wafer is completely chucked on an ideal plane is selected (step 304).

Then, an ideal leveling process is performed for predetermined site size and SFQR is derived as "the maximum value (Max)–the minimum value (Min)" of the leveling residue (step 305).

Next, whether the requirement of a budget relating to a focus variation occurring in the photolithography is satisfied or not is determined for both of the flatness SFQR of the full site and the flatness $SFQR_{SR}$ derived based on the two wafer flatness evaluation results (step 306).

If the requirement is satisfied (OK), the wafer is shipped or a semiconductor device is manufactured by use of the wafer.

If the requirement is not satisfied (NG), the wafer is rejected or the wafer is reworked.

According to the first embodiment, the interaction between the edge shape of the wafer and the holder used at the time of exposure can be considered for the partial site. Therefore, it is possible to solve the problem that an expected performance cannot be exhibited only by use of the evaluation standard by SFQR when the wafer is chucked on the holder of the exposure device actually used.

Further, the possibility of the focus variation amount to exceed the budget becomes weak and a CD variation can be suppressed within a sufficiently permissible range. As a result, occurrence of a focus error in the partial site can be suppressed and the manufacturing yield of the semiconductor device can be enhanced.

In the first embodiment, as the classification example of the site to be evaluated, the site to be evaluated is classified into a partial site or full site. However, the classification example is not limited to this case.

Figure 4A:
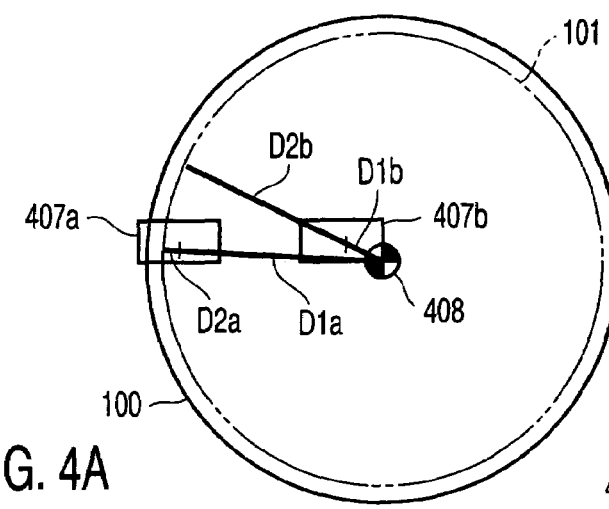
FIGS. 4A, 4B and 4C are plan views of a wafer showing another classification example.

For example, as shown in FIG. 4A, distance D1 (D1a, D1b) between a site 407 (407a, 407b) to be evaluated and the wafer center 408 or distance D2 (D2a, D2b) between the site 407 to be evaluated and the boundary line 101 is derived and the site can be classified according to the derived distance.

Figure 4B:
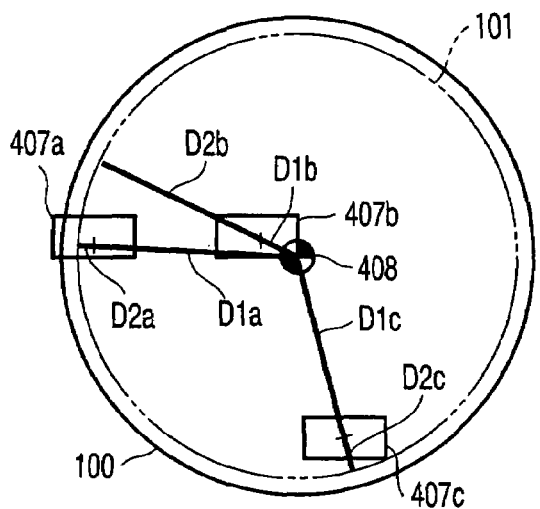

According to the above classification example, for example, the same flatness evaluation as that for the partial site can be made for the full site as indicated by the site 407c shown in FIG. 4B. One of the advantages attained by the above classification example is explained below.

Figure 4C:
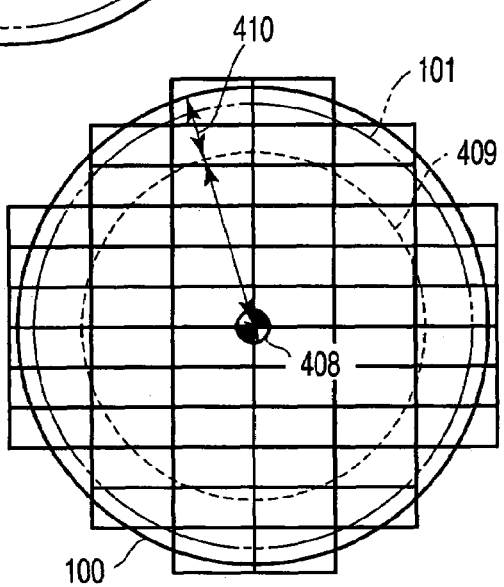

For example, as shown in FIG. 4C, the evaluating site is chucked on a holder 409 in an overhanging state in some cases depending on the type of the wafer holder used as the distance between the site to be evaluated and the wafer center 408 becomes long, that is, as the site becomes closer to the edge of the wafer. A portion which is set into the overhanging state is indicated by a reference symbol 410. When the site is chucked in the overhanging state, the flatness becomes considerably different from the flatness obtained when the wafer is completely chucked on the ideal plane. Therefore, even in the case of the full site, the flatness SFQR thereof becomes different from the flatness $SFQR_{SR}$ which the exposure device senses after chucking. In such a case, even when the site is a full site, it is desirable to fetch information items relating to the front and rear surface shapes of the wafer and the stage shape of the holder and evaluate the site by use of the flatness $SFQR_{SR}$ derived from the front surface shape after chucking.

For example, in order to attain the above evaluation, the distance between the site to be evaluated and the wafer center 408 or the distance between the site to be evaluated and the boundary line 101 is calculated and it is effective to classify the site according to the calculated distance.

Second Embodiment

In the first embodiment, a method for calculating the flatness $SFQR_{SR}$ for each site based on the structure of the holder and the wafer shape measured in the steps 302, 303 and 306 shown in FIG. 3 and determining the flatness is used.

On the other hand, in the second embodiment, it is taken into consideration that the shape finally obtained in the wafer manufacturing process, for example, the free standing edge shape in the wafer surface is relatively constant in the radius vector direction (in a direction along the circumference of the wafer). Thus, the shape (at the upper and lower surfaces) of the wafer in freestanding state is determined, and a criterion is obtained for a condition in which the wafer chucked can have desired flatness $SFQR_{SR}$. Then, the flatness $SFQR_{SR}$ that the wafer chucked has is evaluated.

Figure 5:
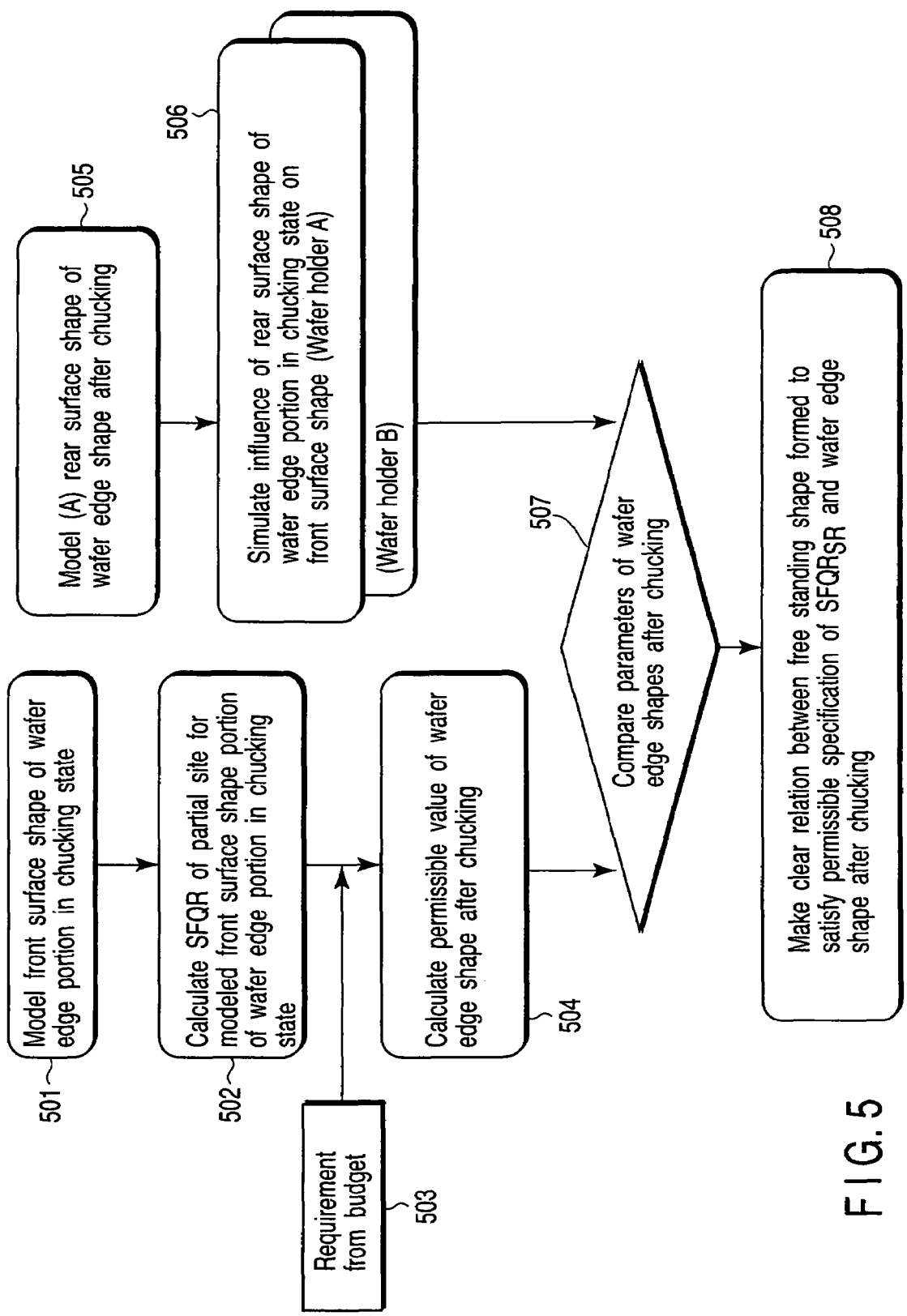
FIG. 5 is a flow diagram showing a wafer flatness evaluation method according to a second embodiment of this invention.

FIG. 5 is a flow diagram showing a wafer flatness evaluation method according to the second embodiment of this invention.

Figure 6:
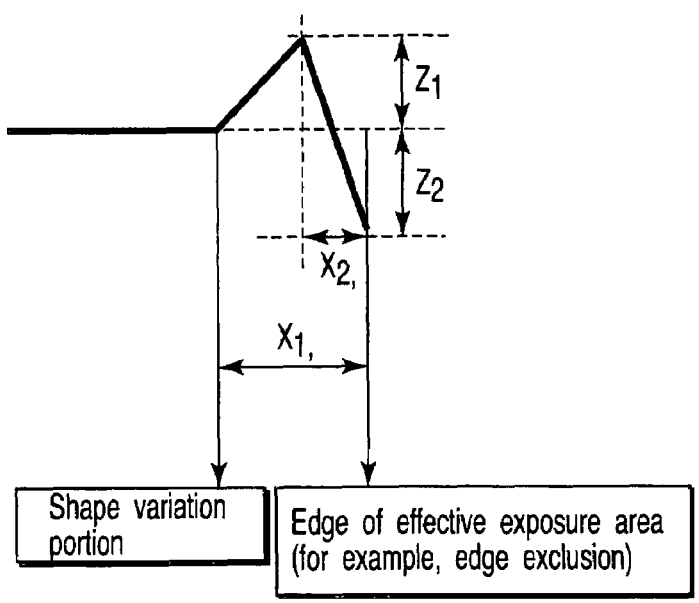
FIG. 6 is a view showing the surface shape of an edge portion of a modeled wafer.

As shown in FIG. 5, the surface shape of the wafer edge portion at the chucking becomes finally important in the photolithography is modeled (step 501). One example of the modeled shape is shown in FIG. 6.

Next, the flatness SFQR of the partial site is calculated for the modeled shape when parameters $Z_1$, $Z_2$, $X_1$, $X_2$ are varied (step 502).

Then, a permissible value of the wafer edge shape after chucking is calculated (step 504) based on the requirement of the budget (step 503). In this case, as one concrete example, the requirement of the budget is set such that the flatness $SFQR_{SR}$ is set to 0.1 μm. If the permissible ranges of the parameters $Z_1$, $Z_2$, $X_1$, $X_2$ shown in FIG. 6 satisfy the following conditions as the result of the calculation, it is understood that the requirement of the budget can be satisfied.

(1) $0 \leq Z_1 \leq 0.12$ μm
(2) $0 \leq Z_2 \leq 0.12$ μm
(3) $X_1 \geq 30$ mm
(4) $X_2 \leq 2$ mm Further, the rear surface shape of the edge portion in the free standing state is modeled (step 505).

Next, an influence given to the front surface shape after chucking when the wafer with the above rear surface shape is chucked on a wafer holder A used is derived by simulation (step 506). In this case, it is desirable to form the model of the rear surface shape in the free standing state with reference to the wafer manufacturing process, measurement data of the wafer edge shape and the like.

Figure 7A:
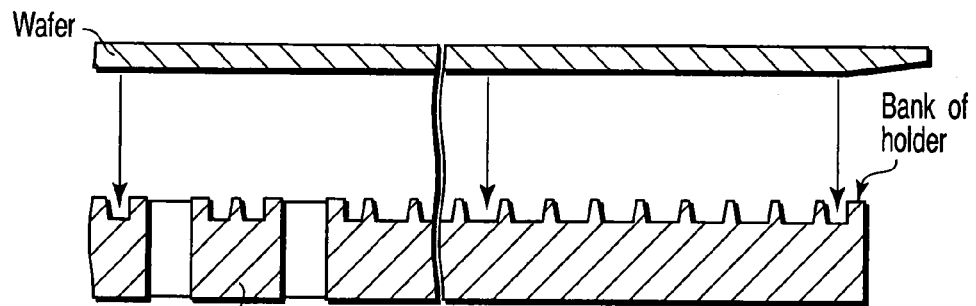
FIGS. 7A and 7B are views showing the cross sections of the modeled rear surface shape and a wafer holder.
Figure 7B:
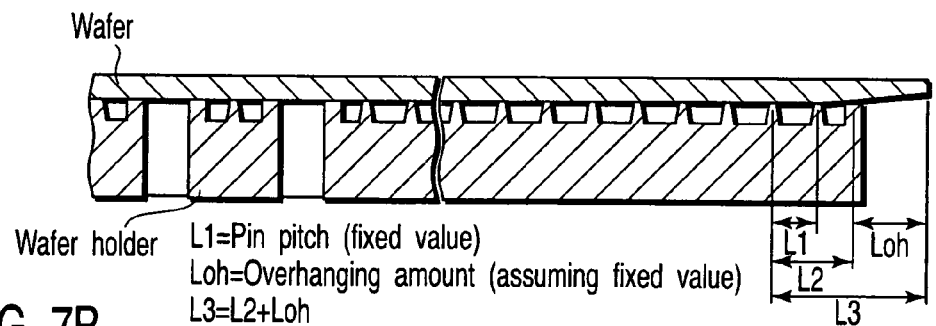

FIGS. 7A, 7B show the cross sections of the modeled rear surface shape and the wafer holder used to perform the process of the steps 505 and 506 of FIG. 5.

It is previously understood that the rear surface of the wafer is tapered according to the wafer manufacturing process and front surface shape data. Therefore, it is assumed that the model of the rear surface shape will have a tapered form.

Figure 8:
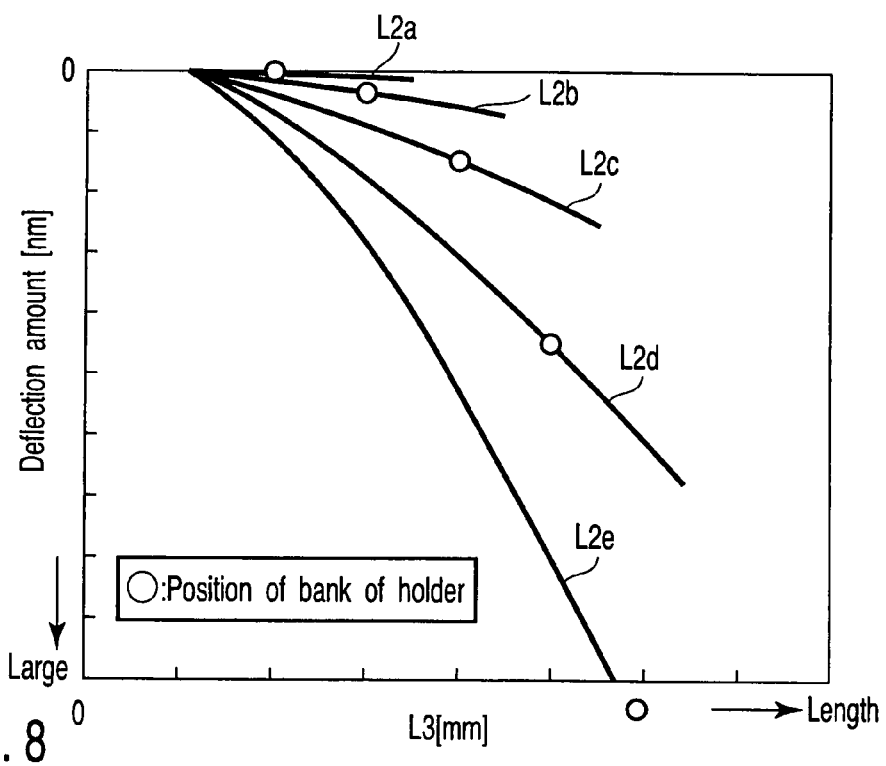
FIG. 8 is a diagram showing the relation between the rear surface shape of the wafer and the deflection amount.
Figure 9A:
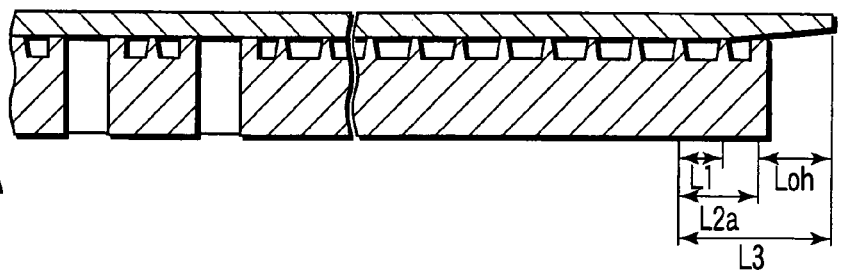
FIGS. 9A, 9B, 9C, 9D and 9E are views respectively showing the states of L2a to L2e shown in FIG. 8.
Figure 9B:
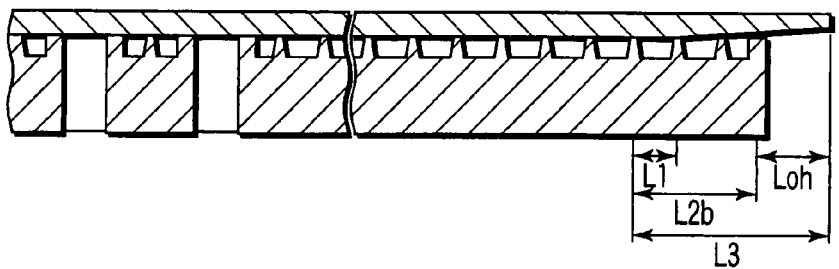
Figure 9C:
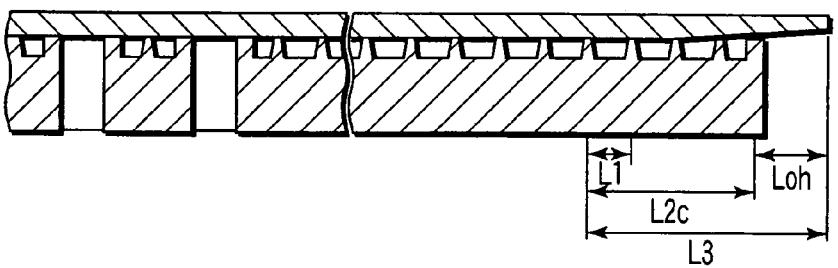
Figure 9D:
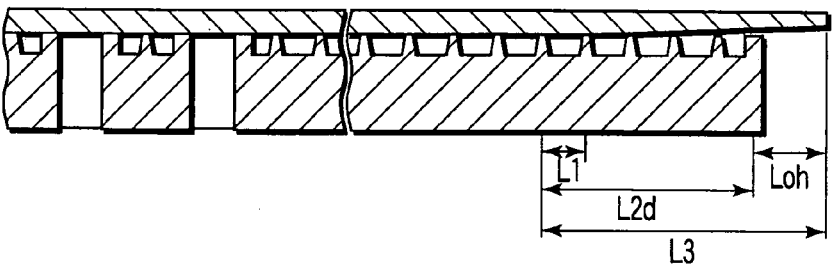
Figure 9E:
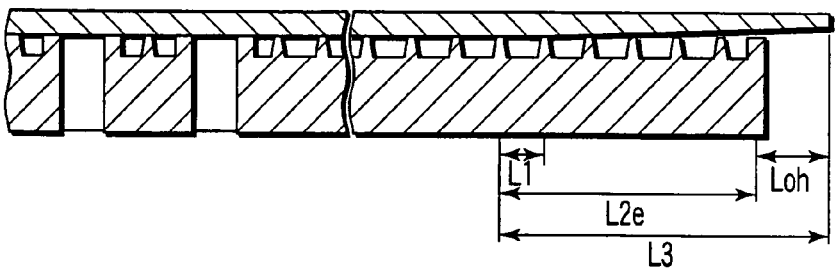

FIG. 8 is a diagram (graph) showing the calculation result of the influence given by the tapered form of the rear surface to the front surface shape after chucking when a wafer holder is used.

The graph shown in FIG. 8 shows the relation between the position in which the tapered portion starts and the deflection amount (tapering amount) of the outermost peripheral portion of the wafer chucked on the wafer holder. That is, it is understood that the wafer is completely chucked if the tapered amount is smaller than the deflection amount shown in the graph. Further, it is understood that the wafer is not completely chucked and set in a floating state (cantilever like) if the tapered amount is larger than the deflection amount shown in FIG. 8. FIGS. 9A to 9E show the states corresponding to L2a to L2e shown in FIG. 8.

By the above procedure, the relation between the free standing shape formed to satisfy the permissible specification of the flatness $SFQR_{SR}$ and the wafer edge shape after chucking can be made clear (step 508) by comparing the results obtained in the steps 504 and 506 (step 507).

The fact shown in FIGS. 8 and 9 suggests that the wafer chucked may assume either of the following two states:

(State 1)
The wafer has its reverse side completely attracted to the wafer holder by suction. In this case, the wafer chucked is determined to have the same surface shape as the shape the reverse side of the wafer has when it is completely attracted to an ideal plane. From the surface shape of the wafer, thus determined, the parameters $Z_1$, $Z_2$, $X_1$ and $X_2$ that are shown in FIG. 6 are obtained. Then, it is determined whether these parameters $Z_1$, $Z_2$, $X_1$ and $X_2$ satisfy the conditions (1) to (4) described above.

(State 2)
The wafer does not have its reverse side completely attracted to the wafer holder by suction. In this case, the surface of the wafer chucked is a little deformed due to the chuck. The surface shape of the wafer in a freestanding state dominantly influences the surface shape of the wafer chucked. Hence, the surface shape of the wafer chucked may be determined from the surface shape the wafer has while standing free. From the surface shape thus determined, the parameters $Z_1$, $Z_2$, $X_1$ and $X_2$ that are shown in FIG. 6 are obtained. Then, it is determined whether these parameters $Z_1$, $Z_2$, $X_1$ and $X_2$ satisfy the conditions (1) to (4) described above. How much the surface shape of the wafer in the free-standing state influences the surface shape of the wafer chucked can be determined from the relation between the tapering at the wafer edge and the flexure of the wafer chucked.

A wafer chucked may assume both State 1 and State 2. More precisely, a part of the wafer may have its reverse side completely attracted to the wafer holder, while the remaining part of the water does not have its reverse side completely attracted to the wafer holder. If this is the case, the first-mentioned part of the wafer is determined to have the same surface shape as the reverse side of the wafer has when it is completely attracted to an ideal plane, and the surface shape of the second-mentioned part of the water is determined from the surface shape the wafer has while standing free.

Whether the reverse side of the wafer is completely attracted to the wafer holder and much the surface shape of the wafer in the freestanding state influences the surface shape of the wafer chucked may depend upon the type of the wafer holder used. Thus, in step 506 (FIG. 5), simulation should better be performed for wafer holders of different types that may be used to hold wafers. In the present embodiment, simulation is carried out for two types of wafer holders, i.e., wafer holder A and wafer holder B.

Thus, the flatness evaluation which satisfies the requirement from the budget can be made by applying the above reference according to the rear surface shape of the partial site of the wafer edge portion.

By using the above method, the relation between the wafer edge shape after chucking and the free standing shape to satisfy the permissible specification of the flatness $SFQR_{SR}$ can be made clear.

Figure 10:
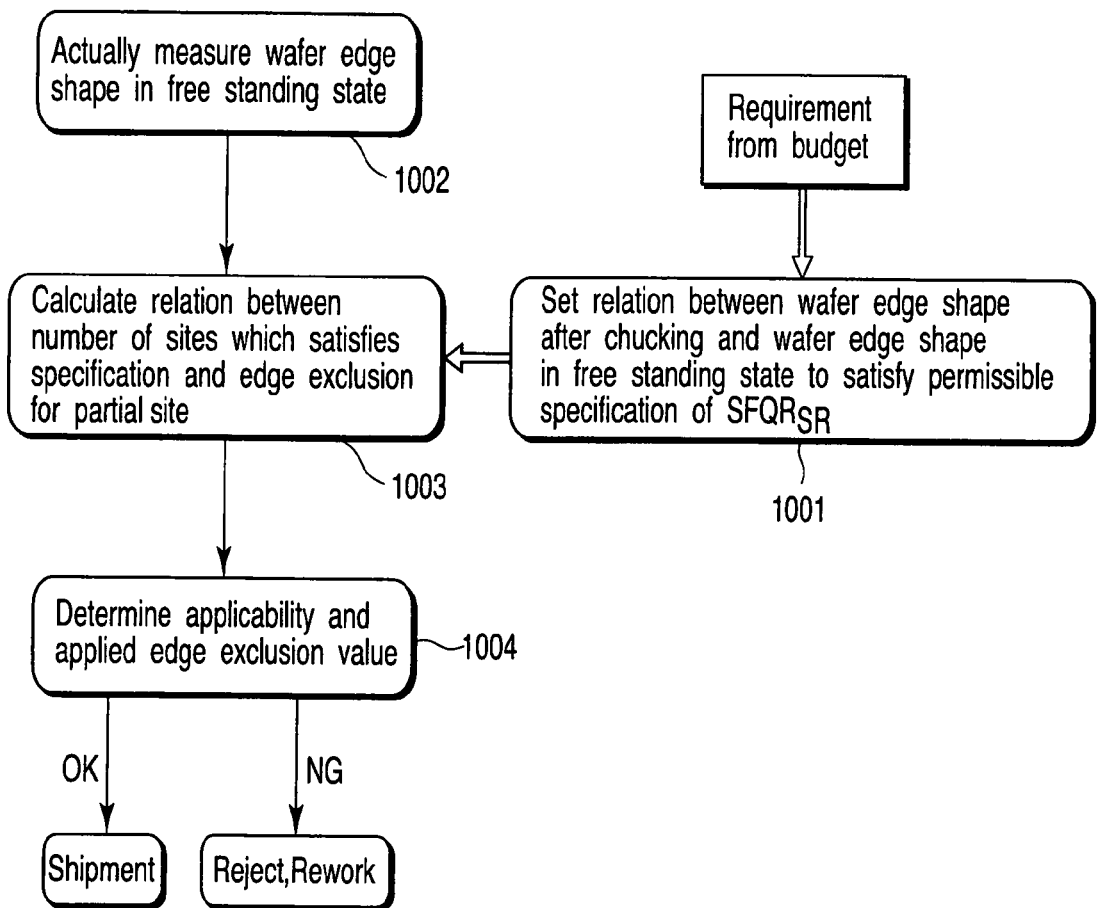
FIG. 10 is a flow diagram showing a wafer selecting method using the wafer flatness evaluation method according to the second embodiment of this invention.

Next, a wafer screening method using the flatness evaluation method according to the second embodiment is shown in FIG. 10.

In the example of the screening method shown in FIG. 10, the relation between the wafer edge shape after chucking and the wafer edge shape in the free standing shape to satisfy the permissible specification of the flatness $SFQR_{SR}$ derived by the procedure shown in FIG. 5 is attained (step 1001). Further, the wafer edge shape in the free standing state is measured (step 1002). The measuring device is not specifically limited to an optical type, contact type, or electrostatic capacitance measurement type measuring instrument and any measurement device can be used if it can measure the wafer shape with necessary resolution.

Next, the edge exclusion area and the number of sites which satisfies the permissible specification are evaluated in the step 1003 and the degree to which the partial site of the wafer satisfies the requirement of the budget is determined. Then, the applicability of the evaluated wafer and the performance in each edge exclusion value are selected (step 1004) and the wafer is shipped or supplied to a rework position.

Also, in the second embodiment, the same effect as that of the first embodiment can be attained.

Further, in the second embodiment, the shape (at the obverse and reverse sides) of the wafer in freestanding state is determined, and a criterion is obtained for a condition in which the wafer chucked can have desired flatness $SFQR_{SR0}$. Then, the flatness $SFQR_{SR}$ that the wafer chucked has is evaluated.

Therefore, it becomes unnecessary to derive the flatness $SFQR_{SR}$ for each partial site, for example, and an advantage that the evaluation time can be reduced in comparison with a case of the first embodiment can be attained.

Third Embodiment

In the first and second embodiments, the wafer flatness evaluation method is selected according to a position of a site to be evaluated. In the third embodiment, the flatness degradation not in a position of the site but in a peculiar portion caused by the restriction on the wafer holder design is correctly evaluated.

Figure 11A:
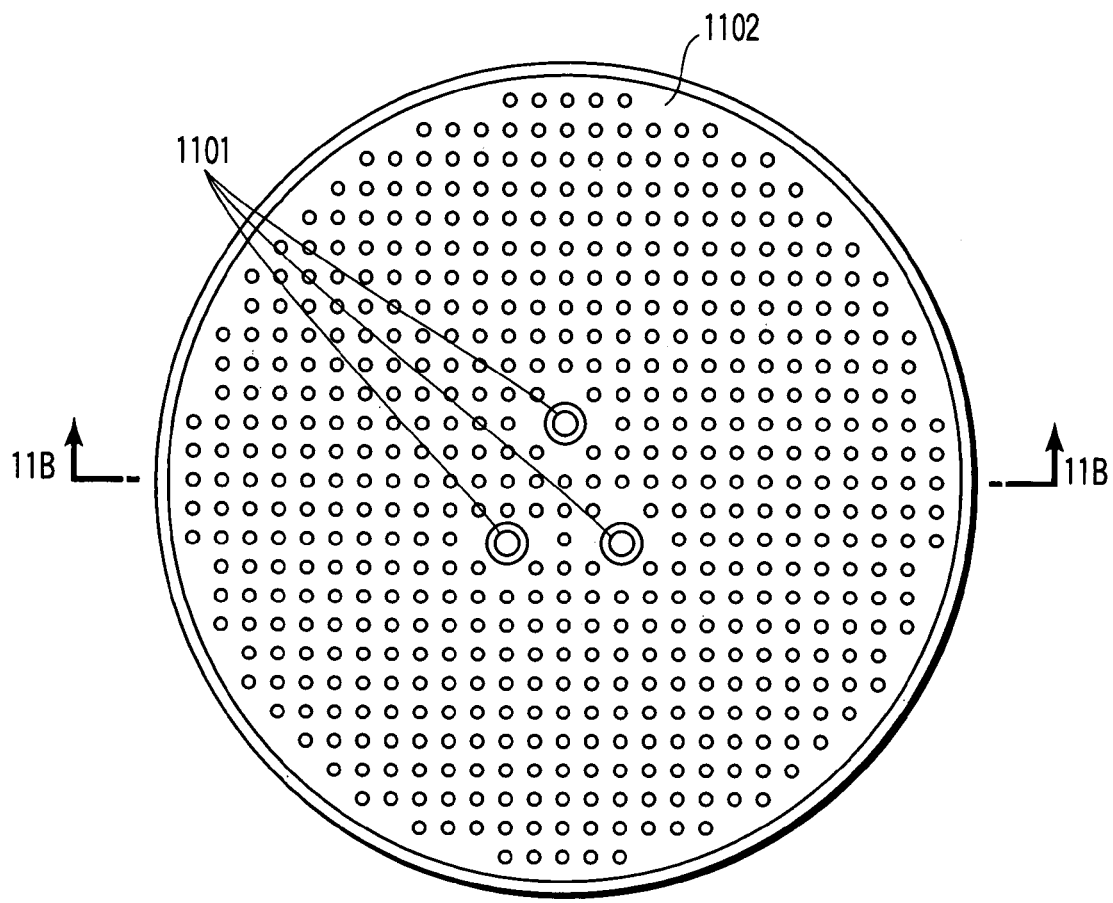
FIG. 11A is a plan view showing a wafer holder.
Figure 11B:
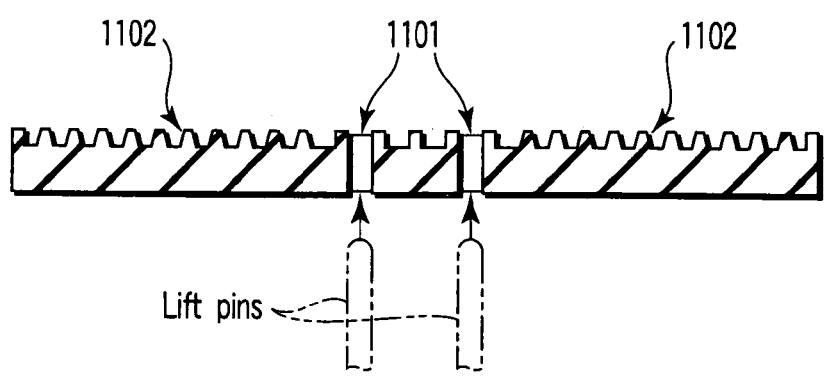
FIG. 11B is a cross sectional view taken along the 11B-11B line of FIG. 11A.

FIG. 11A is a plan view of a wafer holder and FIG. 11B is a cross sectional view taken along the 11B-11B line of FIG. 11A.

As shown in FIGS. 11A and 11B, the holder has three wafer carrying/replacing lift pin holes 1101 in the central portion and the structure is made so as not to cause chucking on portions of the lift pin holes 1101. Unlike pin chuck portions 1102, the lift pin holes 1101 act as peculiar portions caused by the restriction on the wafer holder design. Uniform chucking cannot take place on sites lying on the lift pin holes 1101.

Figure 12:
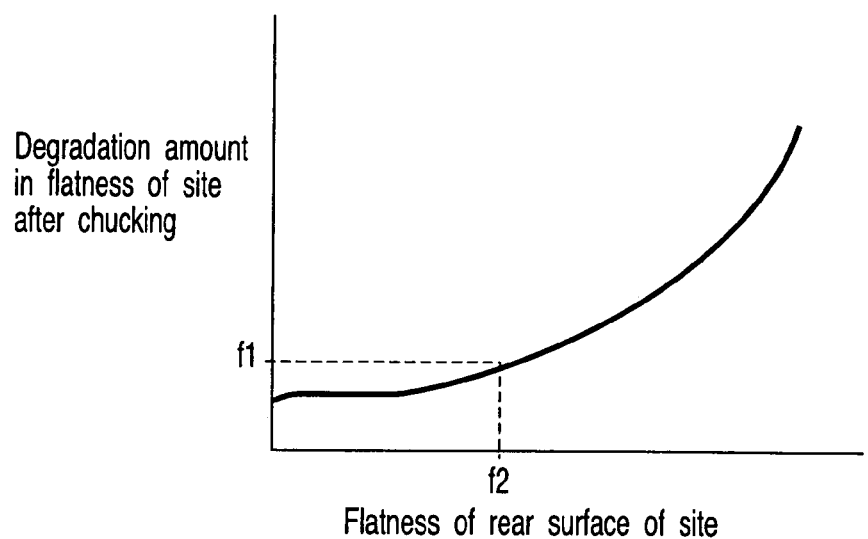
FIG. 12 is a diagram showing the relation between the flatness of the rear surface and the flatness degradation amount after chucking in a peculiar portion.

An influence given to the wafer flatness after chucking is checked for sites lying on the lift pin holes 1101. FIG. 12 shows the relation between the flatness of the rear surface and the flatness degradation amount of the sites lying on the lift pin holes 1101 after chucking.

As is understood from the relation shown in FIG. 12, the flatness degradation becomes a problem in a site in which the flatness degradation amount caused by the lift pin hole 1101 is larger than f1 in FIG. 12, that is, the flatness degradation amount of the rear surface is larger than f2. Therefore, in order to correctly evaluate the site in the above portion, the flatness evaluation method is applied by taking not only the wafer shape but also the structure of the wafer holder. Further, in order to evaluate the site in the other portion, the flatness evaluation method based on the assumption of complete chucking using only wafer shape data is applied.

Also, in the third embodiment, the same effect as that of the first embodiment can be attained.

Further, according to the third embodiment, for example, not only in the partial site, but also in the site lying on the peculiar portion of the wafer holder, for example, in the site lying on the lift pin hole, the flatness can be evaluated in a state similar to that of the flatness which the exposure device senses. As a result, the flatness can be evaluated in a state much more similar to that of the flatness which the exposure device senses in comparison with the case of the first embodiment.

Fourth Embodiment

In the first to third embodiments, the wafer flatness evaluation method which can effectively reflect the wafer flatness in the chucked state based on the positional relation between the wafer and the wafer holder is explained.

On the other hand, the fourth embodiment relates to a method in which an evaluation method is selected by paying much attention not to the positional relation between the wafer and the wafer holder but to the state of the wafer rear surface shape. In this case, an attempt is made to correctly acquire the wafer flatness in a desired chucked state. The method is explained in detail below.

Figure 13A:
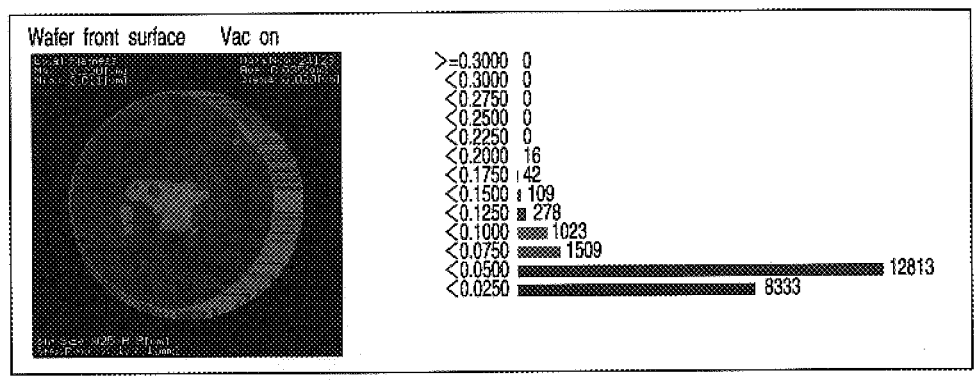
FIG. 13A is a diagram showing the measurement result (rear surface chucking, front surface measurement) of local flatness of a wafer.
Figure 13B:
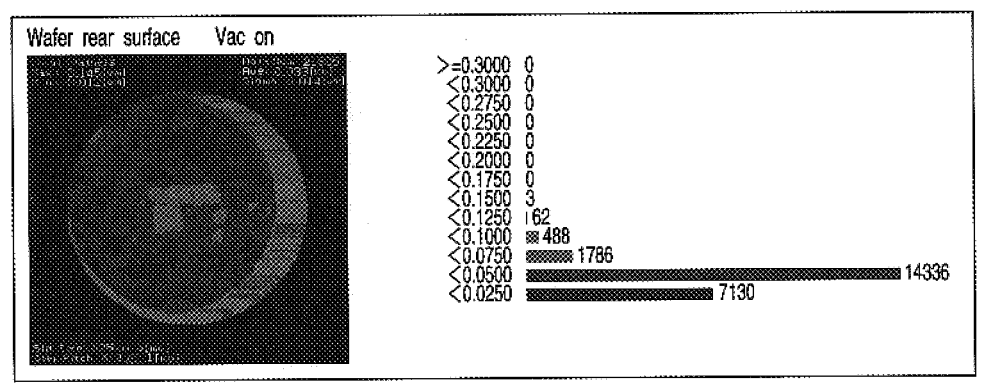
FIG. 13B is a diagram showing the measurement result (front surface chucking, rear surface measurement) of local flatness of a wafer.
Figure 14A:
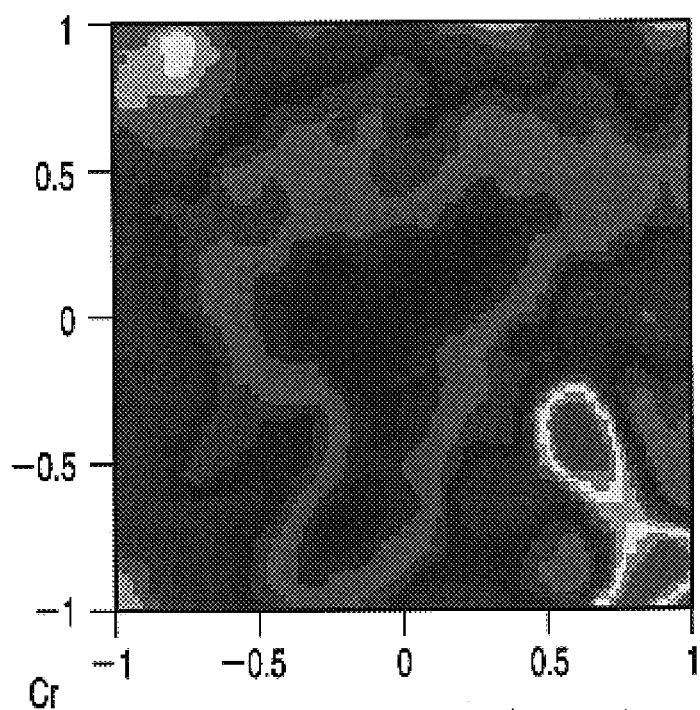
FIG. 14A is a diagram showing the result (rear surface chucking, front surface measurement) of detail investigation of local flatness of a wafer.
Figure 14A:
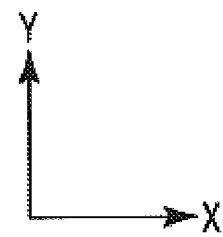
Figure 14B:
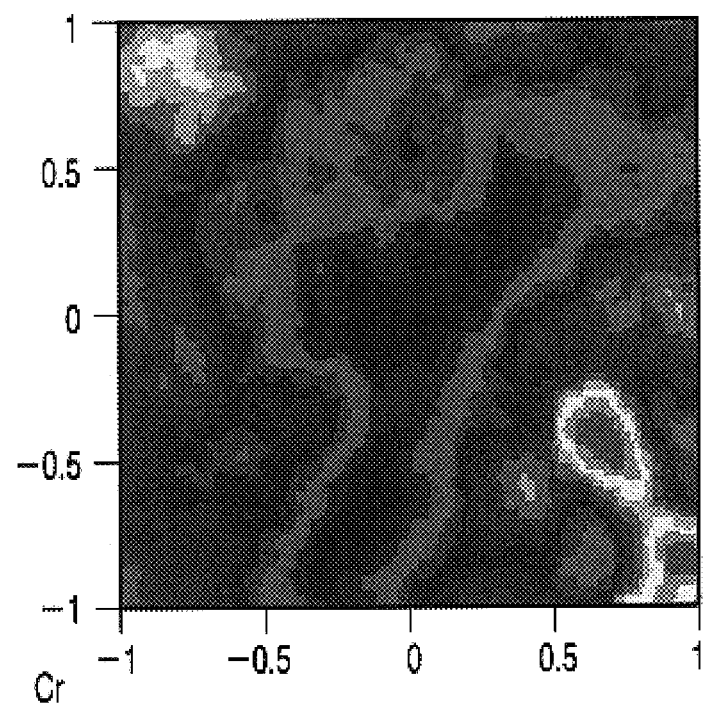
FIG. 14B is a diagram showing the result (front surface chucking, rear surface measurement) of detail investigation of local flatness of a wafer.
Figure 14B:
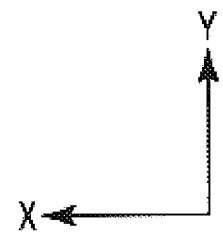

FIG. 13A shows the result of measurement of wafer front surface local flatness (SFQR) with the wafer rear surface chucked. Likewise, FIG. 13B shows the result of measurement of wafer rear surface local flatness with the wafer front surface chucked. In either case, most of the values of the local flatness are distributed below 50 nm and the distribution situations are much similar to each other. The results obtained by investigating the situations in further detail are shown in FIGS. 14A and 14B. FIG. 14A shows the result of front surface measurement with the rear surface chucked and FIG. 14B shows the result of rear surface measurement with the front surface chucked. FIGS. 14A and 14B each show an area of 64 mm×64 mm with high flatness in the central portion of the wafer. For easy observation, the X coordinate is reversed in FIG. 14B. As shown in FIGS. 14A, 14B, both cases are very much similar to each other. If the flatness of the above value, that is, the flatness of approximately 100 mm p-p in the 64 mm square area is provided, it will be understood that the wafer thickness distribution gently propagates to the front surface even when the rear surface or front surface is chucked. In this case, "p-p" expresses peak-to-peak and has the same meaning as "SFQR" (FIG. 32) described before. In this experiment, it is understood that an influence by the wafer holder is not clearly observed and substantially the flatness of only the wafer is measured even though the X coordinate is reversed in FIGS. 14A, 14B.

Figure 15A:
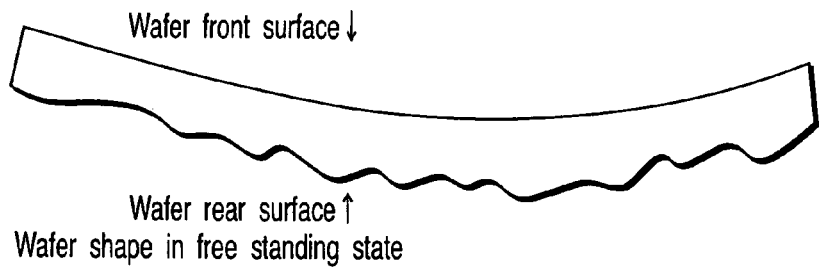
FIG. 15A is a view showing the shape of a wafer in a free standing state.
Figure 15B:
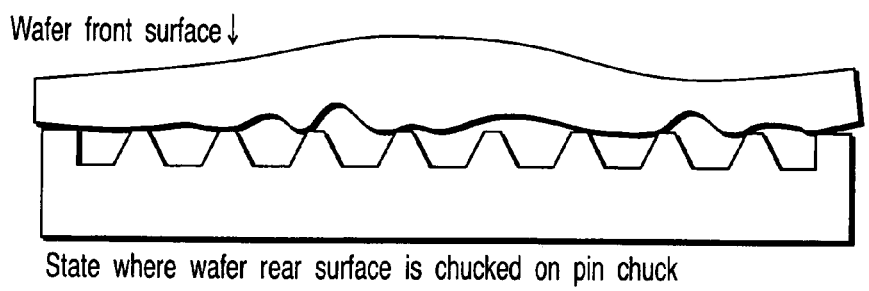
FIG. 15B is a view showing a state where the rear surface of the wafer is chucked on a pin chuck.
Figure 15C:
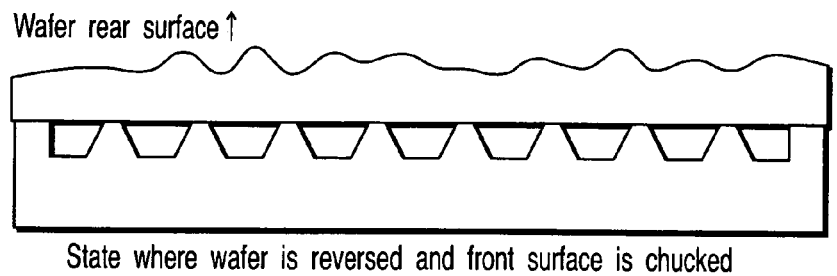
FIG. 15C is a view showing a state where the wafer is reversed and the front surface thereof is chucked.

FIG. 15A shows the free standing state of the wafer and the flatness of the wafer rear surface is generally lower than that of the wafer front surface. This is significant in the case of a single polish wafer. When the rear surface of the wafer is chucked on a pin chuck, the deformation of the wafer is terminated when the balance between the rigidity of the wafer and the air pressure is attained as shown in FIG. 15B. Thus, the wafer does not completely reach the height of the top end of the pin of the pin chuck. Further, the flatness of the wafer front surface is extremely high. Since only warping with the long wavelength and irregular thickness of the wafer appear on the wafer front surface, the wafer front surface completely coincides with the pin chuck as shown in FIG. 15C if the front surface is chucked. If the flatness of the wafer front surface is measured in this situation, the measurement is equivalent to the measurement of the thickness distribution of the wafer.

Propagation of the flatness depends on the magnitude and wavelength of the concave and convex portions of the front and rear surfaces of the wafer. The concave and convex portions appearing on the wafer front surface side are observed in the form of warping with the long wavelength and irregular thickness and the concave and convex portions such as etch pits with the short wavelength are observed on the wafer rear surface. Since the concave and convex portions observed on the wafer front surface have long wavelength, they completely propagate to the non-chucked surface by vacuum suction to the pin chuck when the wafer rear surface or front surface is chucked. However, in the case of the concave and convex portions with the short wavelength on the wafer rear surface, the way of propagation is different depending on the magnitude and wavelength of the concave and convex portions, the pin pitch of the pin chuck, the ring shape of a ring holder and the like. Therefore, in order to understand the way how the flatness of the rear surface propagates to the wafer front surface, it is necessary to chuck the wafer on the wafer holder or do a simulation.

FIG. 14B shows the result of rear surface measurement obtained when the wafer front surface is fixedly held or chucked and the result is substantially equal to the result of wafer thickness distribution measurement. The results obtained by performing the simulation by use of FEM (finite element method) to determine whether the shape of FIG. 14B is reproduced on the wafer front surface when the wafer with the rear surface thickness distribution of FIG. 14B is chucked are shown in FIGS. 16A to 16C and 17A to 17C.

Figure 16A:
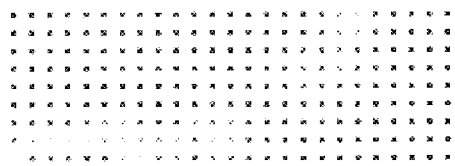
FIGS. 16A, 16B and 16C are diagrams showing the flatness distribution of the wafer rear surface in a corresponding to a pin position, simulation result with a modified wafer and stress distribution on the pin.
Figure 16B:
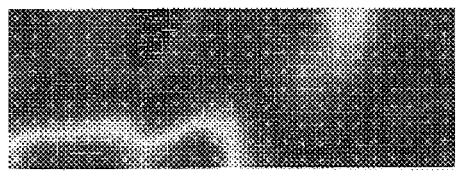
Figure 16C:

FIG. 16A shows the result obtained by extracting a partial area of 8 mm×25 mm from the actual measurement values of FIG. 14B (in this example, 33.3 nm p-p), mounting the same on pins of 1 mm pitch and dealing with the thus obtained flatness distribution as the wafer rear surface flatness distribution (FIG. 16A). The wafer front surface shape obtained when the wafer is deformed by use of the atmospheric pressure is derived (FIG. 16B: in this case, 29 nm p-p propagates to the front surface). Likewise, the stress distribution on the pins is derived and pin portions which are brought into contact with the wafer are indicated by void portions (FIG. 16C).

Figure 17A:
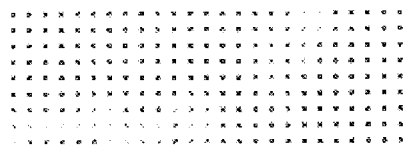
FIGS. 17A, 17B and 17C are diagrams showing the flatness distribution of the wafer rear surface corresponding to a pin position, simulation result with a modified wafer and stress distribution on the pin.
Figure 17B:
Figure 17C:

FIG. 17A shows the result obtained by multiplying only the magnitude of the flatness of FIG. 16A by four to derive the wafer rear surface flatness distribution by use of the same method. The flatness of the area of 8 mm×25 mm is 133.2 nm p-p and set on the pins with the pitch of 1 mm of the pin chuck as the flatness of the wafer rear surface. The wafer front surface shape obtained when the wafer is deformed by use of the atmospheric pressure is derived (FIG. 17B: in this case, 109.8 nm p-p propagates to the front surface). Likewise, the stress distribution on the pins is derived and pin portions which are brought into contact with the wafer are indicated by void portions (FIG. 17C).

Figure 18:
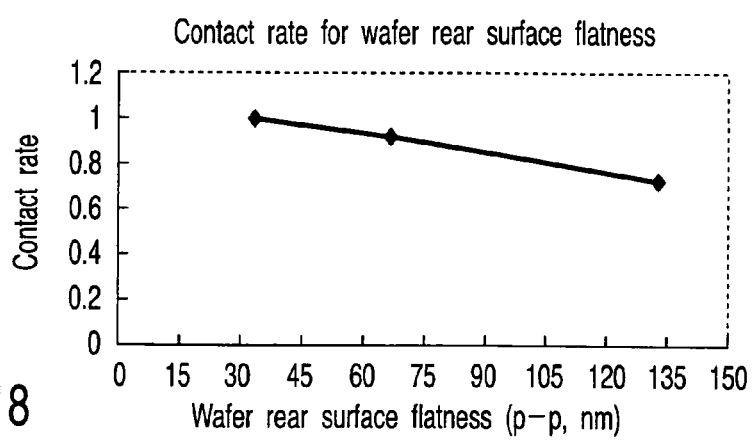
FIG. 18 is a diagram showing the relation between the flatness of the wafer rear surface and a contact rate.

FIG. 18 shows the pin contact rate with respect to wafer flatness derived by the present method. In a case where the local flatness in the area of 8×25 mm$^2$ is approximately 30 nm p-p, approximately 100% of the flatness propagates to support the experimental results of FIGS. 14A, 14B, but the contact rate is lowered as the flatness is degraded.

Figure 19:
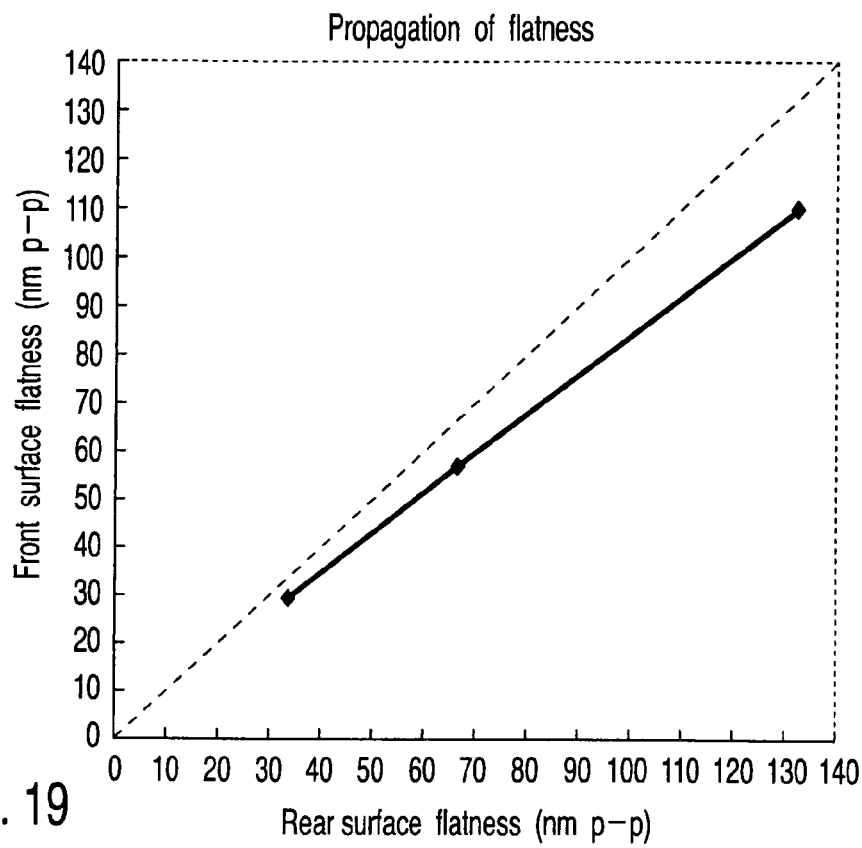
FIG. 19 is a diagram showing the relation between the flatness of the rear surface and the flatness of the front surface of the wafer.

FIG. 19 shows estimated values of the propagation rate of the rear surface flatness to the front surface by use of the flatness values nm p-p of the rear and front surfaces.

Figure 20:
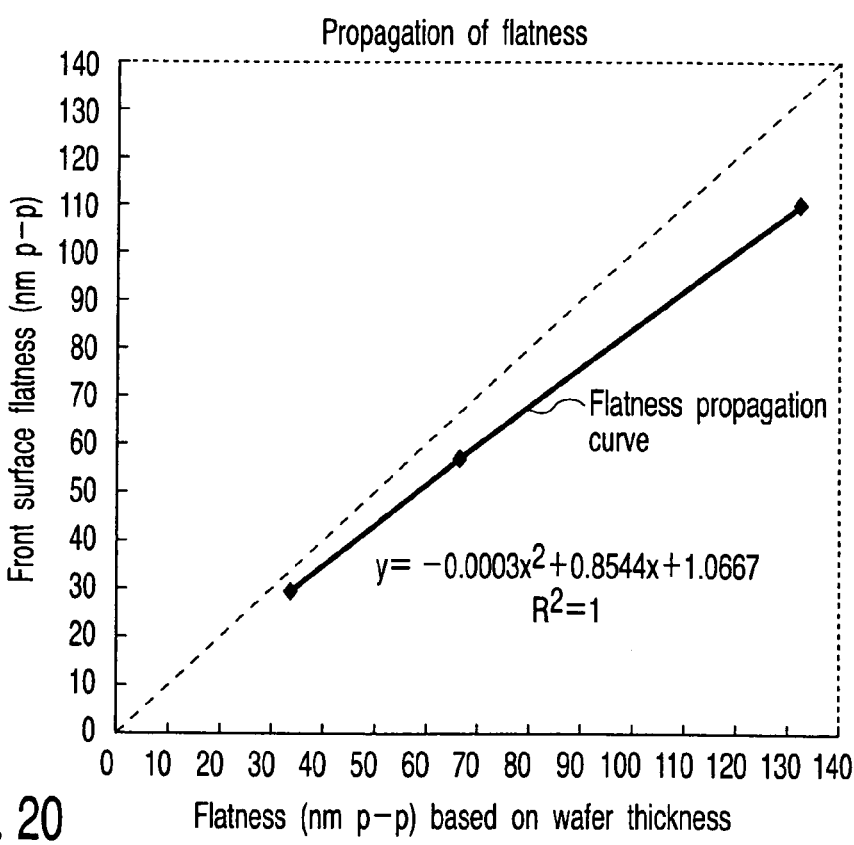
FIG. 20 is a diagram showing the relation between the flatness based on the wafer thickness and the front surface flatness.

At the time of chucking of the wafer rear surface, concave and convex portions with long wavelength are present on both of the front and rear surfaces of the wafer. However, in this case, it is permitted to consider that 100% of the concave and convex portions will appear on the front surface when estimating the degree to which the wafer rear surface flatness propagates to the wafer front surface. On the other hand, concave and convex portions with short wavelength do not propagate by 100% to the wafer front surface and the propagation rate becomes a problem. However, fortunately, the concave and convex portions with short wavelength are present only on the wafer rear surface. Therefore, there occurs no problem even if the results obtained by measuring the wafer thickness distribution in the free standing state of the wafer are dealt with as the rear surface flatness distribution (FIG. 13B) obtained when the wafer rear surface is measured with the wafer front surface chucked. That is, there occurs no problem even when the rear surface flatness on the abscissa of FIG. 19 is read as the flatness based on the wafer thickness as shown in FIG. 20. By thus reading the flatness, the abscissa indicates the result obtained by a general wafer thickness measuring device. It becomes possible to predict the measurement result of the flatness of the wafer front surface obtained when the wafer is chucked on an actual wafer holder based on the above result.

As described above, the user can selectively use an evaluation method which reflects the wafer flatness result obtained in the chucked state which is originally required to be set.

Figure 21:
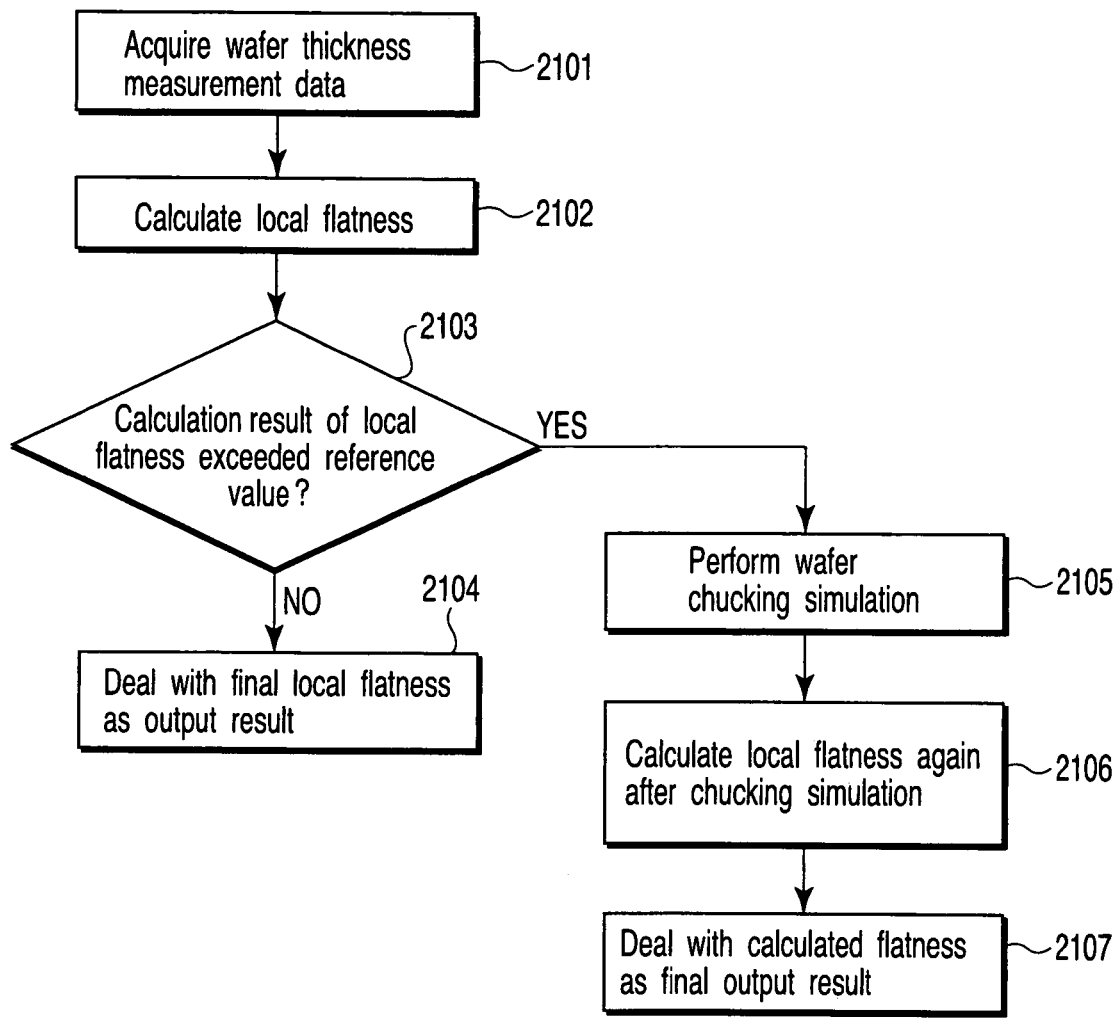
FIG. 21 is a flow diagram showing a first example of a wafer flatness evaluation method according to a fourth embodiment of this invention.

FIG. 21 is a flowchart showing the fourth embodiment of this invention. As wafer thickness data, thickness data in the free standing state may be used. Local flatness is calculated based on thickness irregularity data by use of a wafer rear surface reference (on the assumption that the wafer rear surface is made completely flat by vacuum chucking). A case wherein the result exceeds a reference value, for example, the wafer rear surface flatness exceeds approximately 30 nm in FIG. 18 is considered. In this case, a wafer chucking simulation is performed by using the FEM method described before for a local area giving the flatness. Then, the wafer front surface shape after deformation by chucking is calculated, local flatness based on the wafer front surface shape is calculated, and the final result is output. Whether the reference value is exceeded or not is determined for each local area and it is not necessary to run the FEM simulation for the whole local area. It is preferable to previously determine the reference value for each type of wafer by actual measurement or simulation.

Figure 22:
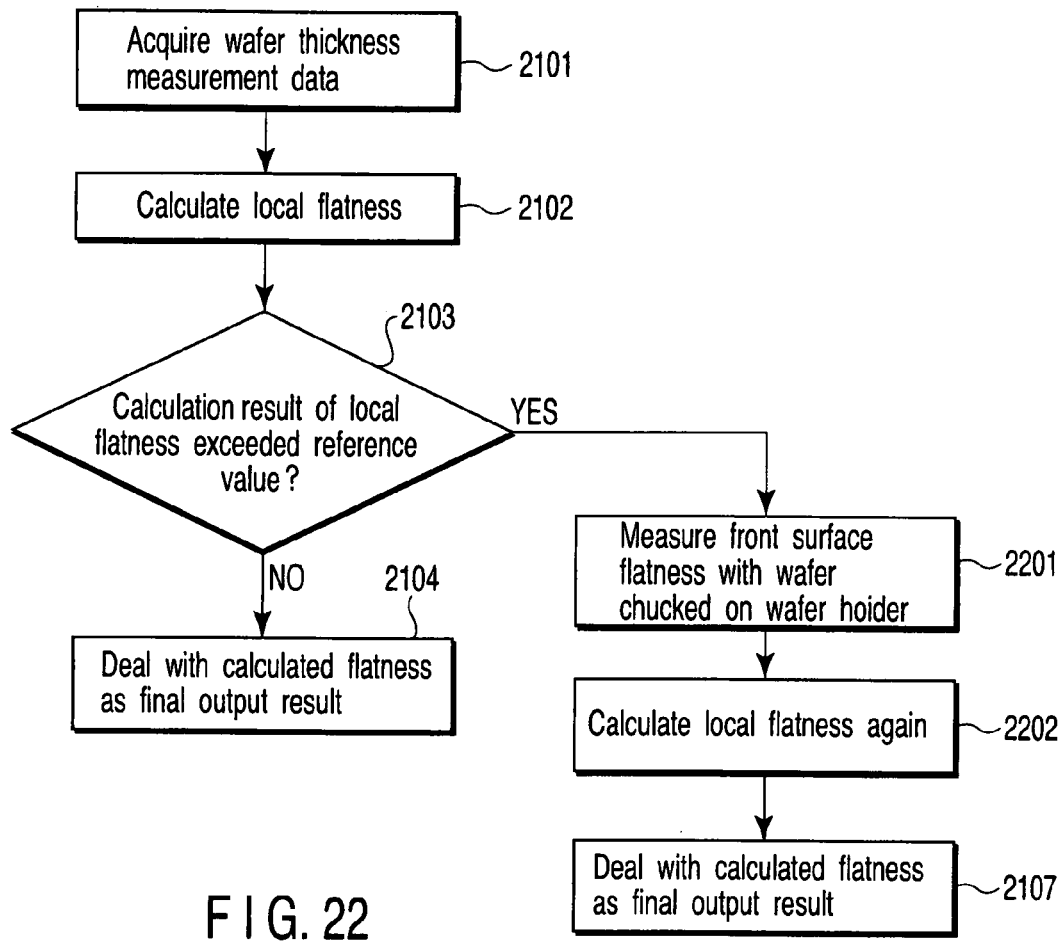
FIG. 22 is a flow diagram showing a second example of the wafer flatness evaluation method according to the fourth embodiment of this invention.

Further, it is possible to replace the wafer chucking simulation process shown in FIG. 21 by observation of the flatness of the front surface chucked on the wafer holder actually used. More specifically, the flowchart of FIG. 22 is used. In this case, as the wafer thickness, thickness data in the free standing state may be used. Local flatness is calculated based on thickness irregularity data by use of a wafer rear surface reference (on the assumption that the wafer rear surface is made completely flat by vacuum chucking). A case wherein the result exceeds the reference value, for example, the wafer rear surface flatness exceeds approximately 30 nm in FIG. 18 is considered. Then, a wafer is chucked on the wafer holder and the flatness of the wafer front surface is measured. Local flatness is calculated based on the flatness and used as a final output.

In a case where a flatness measuring equipment based on a Fizeau's interference system which can make the measurement for the entire surface in a short period of time is used, a wafer in which the reference value is exceeded in at least one portion is chucked and the entire surface of the wafer is measured again. It is preferable to previously determine the reference value for each type of wafer by actual measurement or simulation.

Figure 23:
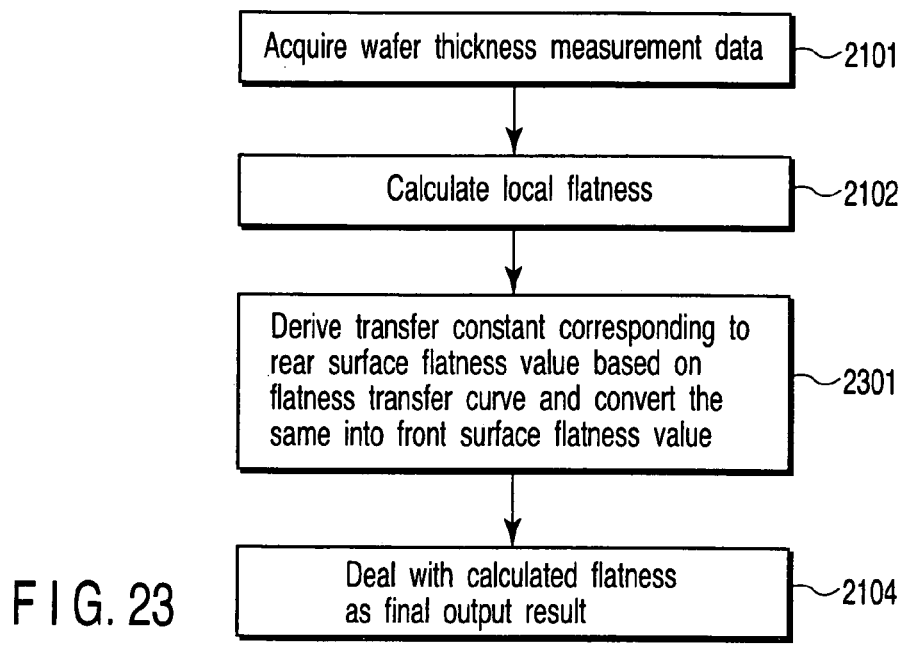
FIG. 23 is a flow diagram showing a third example of the wafer flatness evaluation method according to the fourth embodiment of this invention.

Further, the front surface flatness of the wafer in the chucked state can be derived by using the flowchart of FIG. 23. In FIG. 23, as the wafer thickness, thickness data in the free standing state is used. Local flatness is calculated based on thickness irregularity data by use of a rear surface reference. Then, a transfer constant which is determined based on the above result and a previously derived flatness transfer curve as shown in FIG. 20 may be derived, the transfer constant may be multiplied by the local flatness value of the rear surface reference and the result of multiplication may be used as a final output. In this method, for flatness evaluation with high precision, it is preferable to derive a flatness transfer curve for each combination of the type of the wafer and the wafer holder used by actual measurement or simulation.

Fifth Embodiment

In the fifth embodiment, a wafer flatness evaluation apparatus which evaluates the flatness by using a wafer flatness evaluation method according to this invention is explained.

FIG. 24 is a block diagram showing a first example of the wafer flatness evaluation apparatus according to the fifth embodiment of this invention.

The first example of the evaluation apparatus is configured as shown in FIG. 24. The front surface shape of a wafer to be evaluated in the free standing state is measured by a front surface shape measuring equipment 2401 and the rear surface shape is measured by a rear surface shape measuring equipment 2402. As examples of the measuring equipments 2401, 2402, equipments of optical system or electrostatic capacitance system can be given. However, the equipments are not limited to the above equipments. Shape data obtained by the measuring equipments 2401, 2402 is transferred to and stored in a wafer data storage section 2403. Stored data is not limited to one sheet and may correspond to a plurality of sheets in some cases.

Information relating to the stage shape of the wafer holder and information relating to the structure of a chucking portion are previously stored in a holder data storage section 2404. The storage data is not limited to one type of holder data and may correspond to plural types of holder data.

Data stored in the wafer data storage section 2403 is transferred to a flatness calculating section 2405 as required and divided into data items for each site. Data divided for each site is classified by use of one of the following references according to the position of the site to be evaluated.

(1) Data is classified according to whether the site to be evaluated is a partial site or full site (refer to the first embodiment).

(2) The distance D1 between the site to be evaluated and the wafer center or the distance D2 between the site to be evaluated and the boundary line 101 is calculated and the site is classified into a site lying near the edge portion of the wafer and a site lying far away from the edge portion of the wafer according to the calculated distance (refer to the first embodiment, FIGS. 4A, 4B).

(3) Data is classified according to whether or not the site to be evaluated has a non-chucked portion (refer to the third embodiment).

Information relating to the structure of the chucking portion and information relating to the stage shape of the wafer holder are transferred from the holder data storage section 2404 to the flatness calculating section 2405 in a parallel or serial fashion with respect to data transfer from the wafer data storage section 2403.

The flatness calculating section 2405 make the following flatness calculations (1'), (2'), (3') according to the classifications (1), (2), (3).

(1') The front surface shape of the wafer edge portion when the wafer is chucked on the wafer holder is calculated for the site classified into the partial site by taking information relating to the stage shape of the wafer holder and information relating to the structure of the chucking portion into consideration. Then, flatness $SFQR_{SR}$ which the exposure device, for example, scanner senses is derived for each site. Further, the front surface shape obtained when the wafer is completely chucked on an ideal plane is calculated for the site classified into the full site.

(2') The front surface shape of the wafer edge portion when the wafer is chucked on the wafer holder is calculated for the site classified into the site lying near the wafer edge portion by taking information relating to the stage shape of the wafer holder and information relating to the structure of the chucking portion into consideration. Then, flatness $SFQR_{SR}$ which the exposure device, for example, scanner senses is derived for each site. Further, the front surface shape obtained when the wafer is completely chucked on an ideal plane is calculated for the site classified into the site lying far away form the wafer edge portion.

(3') The front surface shape of the wafer edge portion when the wafer is chucked on the wafer holder is calculated for the site classified into the site having a non-chucked portion by taking information relating to the stage shape of the wafer holder and information relating to the structure of the chucking portion into consideration. Then, flatness $SFQR_{SR}$ which the exposure device, for example, scanner senses is derived for each site. Further, the front surface shape obtained when the wafer is completely chucked on an ideal plane is calculated for the site classified into the site having no non-chucked portion.

If plural types of wafer holders are used instead of using one type of wafer holder, the flatness $SFQR_{SR}$ is calculated for each holder. For example, the worst one of the calculated flatness values $SFQR_{SR}$ is used as the flatness $SFQR_{SR}$ or each flatness $SFQR_{SR}$ is derived for each holder. The thus derived data is transferred to a pass/fail determining section 2406.

In the pass/fail determining section 2406, an ideal leveling process is performed for each site and SFQR is derived as "the maximum value (Max)–the minimum value (Min)" of the leveling residue. The result indicating whether the thus calculated values satisfy the requirement of the budget relating to a focus variation in the photolithography is output. When the flatness evaluating method according to the fourth embodiment is carried out, the flatness calculating section 2405 performs the steps 2103 to 2107, 2201, 2202 and 2301 shown in FIGS. 21 to 23.

According to the first example of the evaluating apparatus, the flatness evaluating process based on the flatness evaluating method according to the first, third or fourth embodiment can be performed.

FIG. 25 is a block diagram showing a second example of the wafer flatness evaluation apparatus according to the fifth embodiment of this invention.

The second example of the evaluating apparatus is configured as shown in FIG. 25. The front surface shape of the edge portion of a wafer to be evaluated in the free standing state is measured by an edge portion front surface shape measuring equipment 2501 and the edge portion rear surface shape is measured by an edge portion rear surface shape measuring equipment 2502. As examples of the measuring equipments 2501, 2502, equipments of optical type or contact type step (difference-in-level) meter, or electrostatic capacitance measurement type step meter can be given. However, the equipments are not limited to the above equipments if they can measure the edge shape with required resolution. Edge portion shape data is transferred to and stored in a wafer data storage section 2503. Stored data is not limited to one sheet and may correspond to a plurality of sheets in some cases.

Like the first example, information relating to the stage shape of the wafer holder and information relating to the structure of a chucking portion are previously stored in a holder data storage section 2504. Like the first example, the storage data is not limited to one type of holder data and may correspond to plural types of holder data in some cases.

Information stored in the holder data storage section 2504 and data stored in the wafer data storage section 2503 are transferred to a flatness calculating section 2505 as required.

In the flatness calculating section 2505, the front surface shape of the edge portion when the wafer to be evaluated is chucked on the wafer holder is predicted and parameters $Z_1$, $Z_2$, $X_1$, $X_2$ (refer to the second embodiment, FIG. 6) are derived.

Then, the parameters $Z_1$, $Z_2$, $X_1$, $X_2$ derived by the flatness calculating section 2505 are transferred to the pass/fail determining section 2506. In the pass/fail determining section 2506, the number of sites which satisfies the permissible specification is evaluated, the degree to which the partial site of the wafer satisfies the requirement of the budget is determined and the result is output.

In this case, if plural types of wafer holders are used instead of using one type of wafer holder, the degree to which the partial site of the wafer satisfies the requirement of the budget is determined for each holder.

Thus, according to the second example of the evaluating apparatus, the flatness evaluation process based on the flatness evaluation method according to the second embodiment can be performed.

In the first and second examples, only a portion surrounded by U1 indicated in FIG. 24 or 25 or a portion surrounded by U2 may be placed in a clean room in which the front and rear surface shapes of the wafer are actually measured. The other portion may be placed in a location apart from the above portion. For example, the portion surrounded by U1 or the portion surrounded by U2 can be placed in a wafer manufacturing company and the other portion can be possessed by a purchaser so as to make it possible to determine pass/fail of a to-be-evaluated wafer.

Sixth Embodiment

As the sixth embodiment, a wafer manufacturing method using a wafer flatness evaluating method according to this invention is explained.

Figure 26:
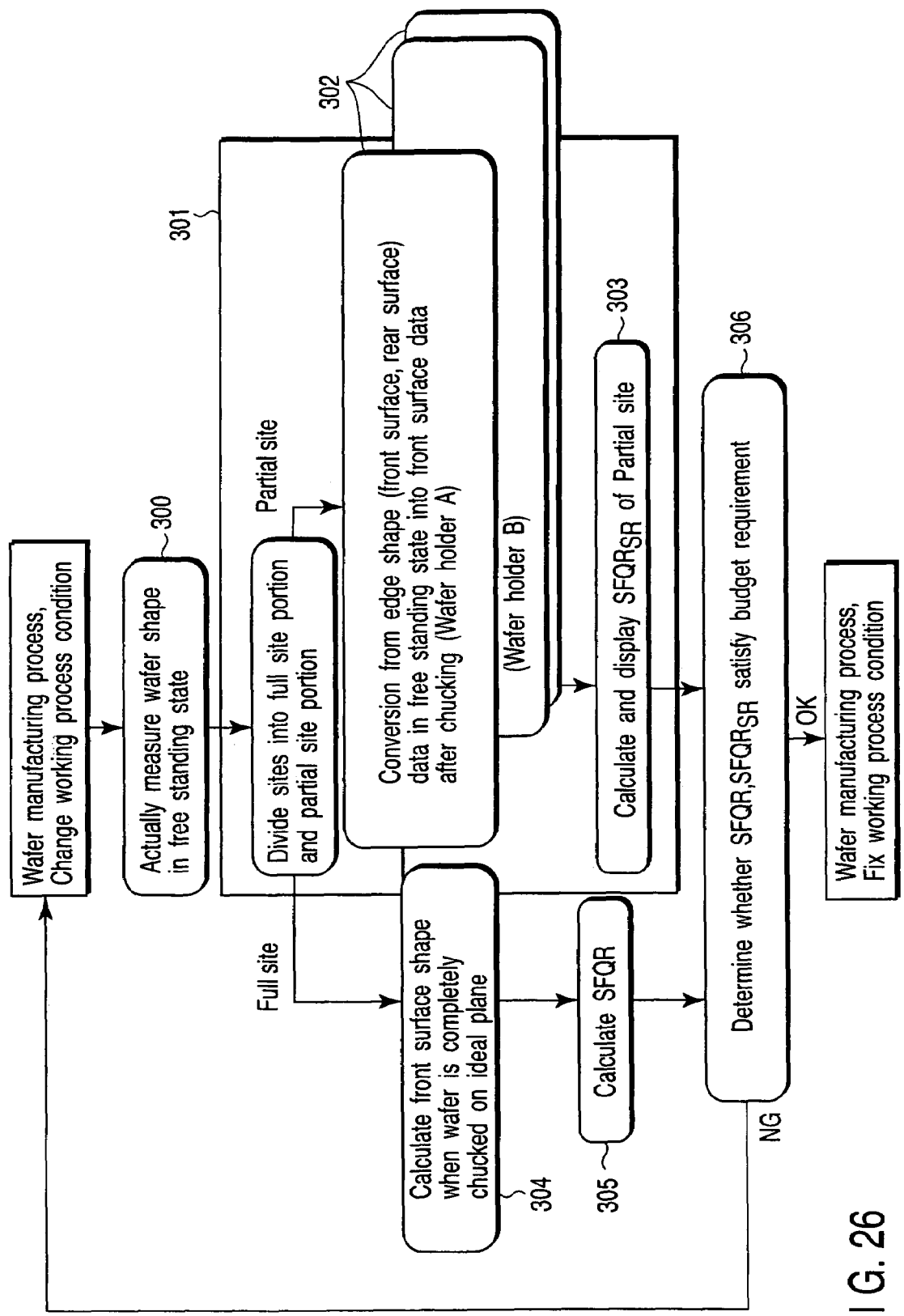
FIG. 26 is a flow diagram showing a first example of a wafer manufacturing method according to a sixth embodiment of this invention.

FIG. 26 is a flow diagram showing a first example of the wafer manufacturing method according to the sixth embodiment.

As shown in FIG. 26, the wafer manufacturing method is to form a wafer based on the set work condition and the set process condition and attain the flatness in the wafer surface of the thus formed wafer according to the first embodiment, for example. When the flatness in the wafer surface satisfies the requirement from the budget, the set working process condition is fixed. When the flatness in the wafer surface does not satisfy the requirement from the budget, the set working process condition is changed.

Thus, the working process condition for the wafer can be optimized by feeding back the result of flatness evaluation obtained according to the first embodiment to the wafer manufacturing process. As a result, for example, it becomes possible attain an advantage that a wafer with the flatness which satisfies the requirement from the budget can be efficiently manufactured.

Figure 27:
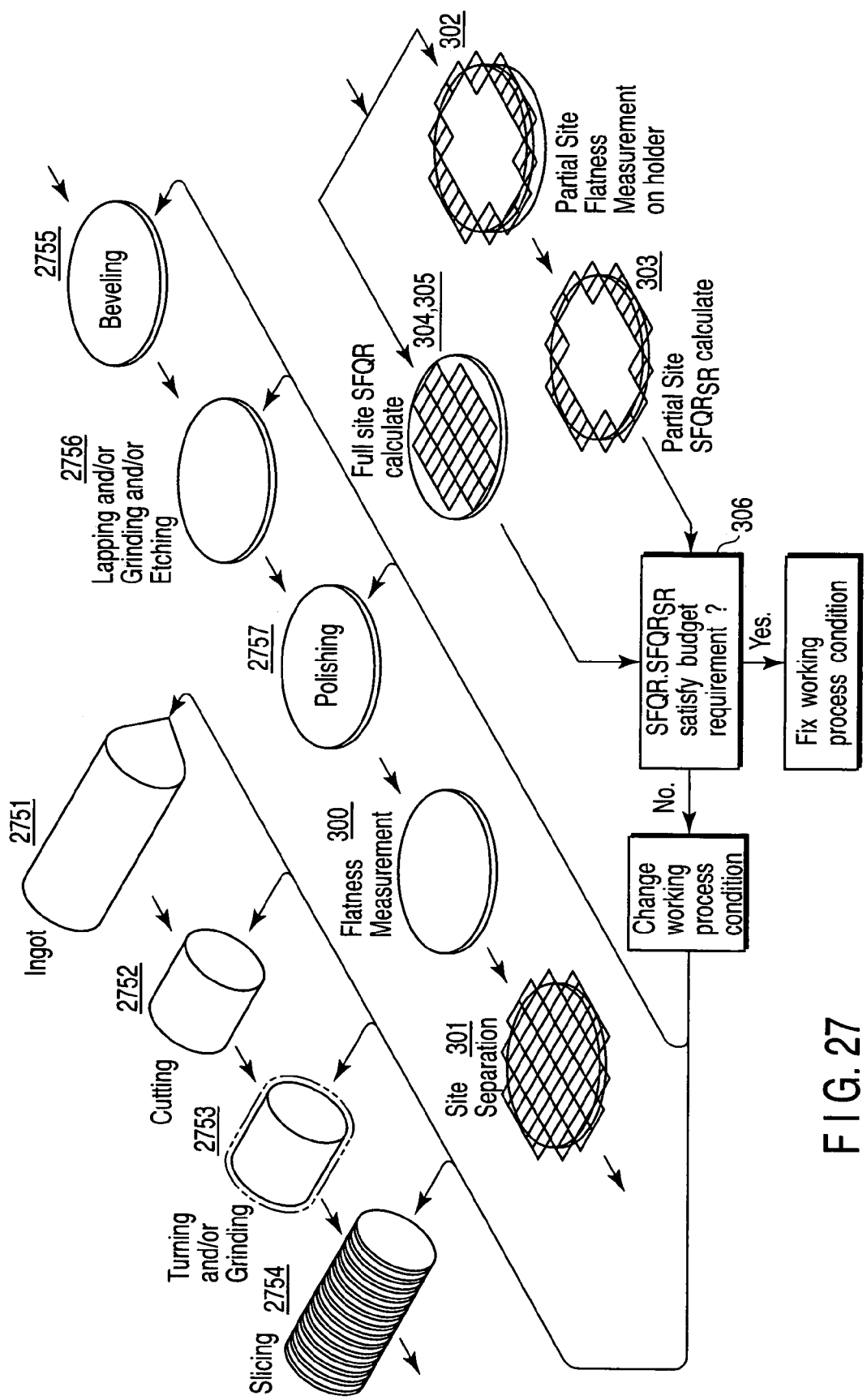
FIG. 27 is a view showing an example of the process of the first example of the wafer manufacturing method according to the sixth embodiment of this invention.

One concrete example of the wafer manufacturing method is shown in FIG. 27.

As shown in FIG. 27, an ingot of semiconductor single crystal such as silicon single crystal is formed by use of a known method (step 2751).

Then, a block is cut out from the ingot (step 2752).

Next, the peripheral portion of the cutout block is turned and/or ground to set the block diameter to, for example, 8 inch, 12 inch or the like (step 2753).

After this, the turned and/or ground block is sliced to obtain coarse wafers (step 2754).

Then, the edge portion of the coarse wafer is beveled to work the edge portion of the coarse wafer into a preset shape, for example, tapered shape (step 2755).

The front surface and/or rear surface of the thus beveled coarse wafer is lapped and/or ground and/or etched to set the coarse wafer thickness to preset wafer thickness (step 2756).

Next, the front surface and/or rear surface of the coarse wafer subjected to the process of the step 2756 is polished to obtain a finished wafer (step 2757).

After this, the flatness in the finished wafer surface is acquired by the flatness evaluation method of the first embodiment. If the flatness in the finished wafer surface does not satisfy the requirement from the budget, at least one of the working process conditions in the steps 2751 to 2757 is changed.

Figure 28:
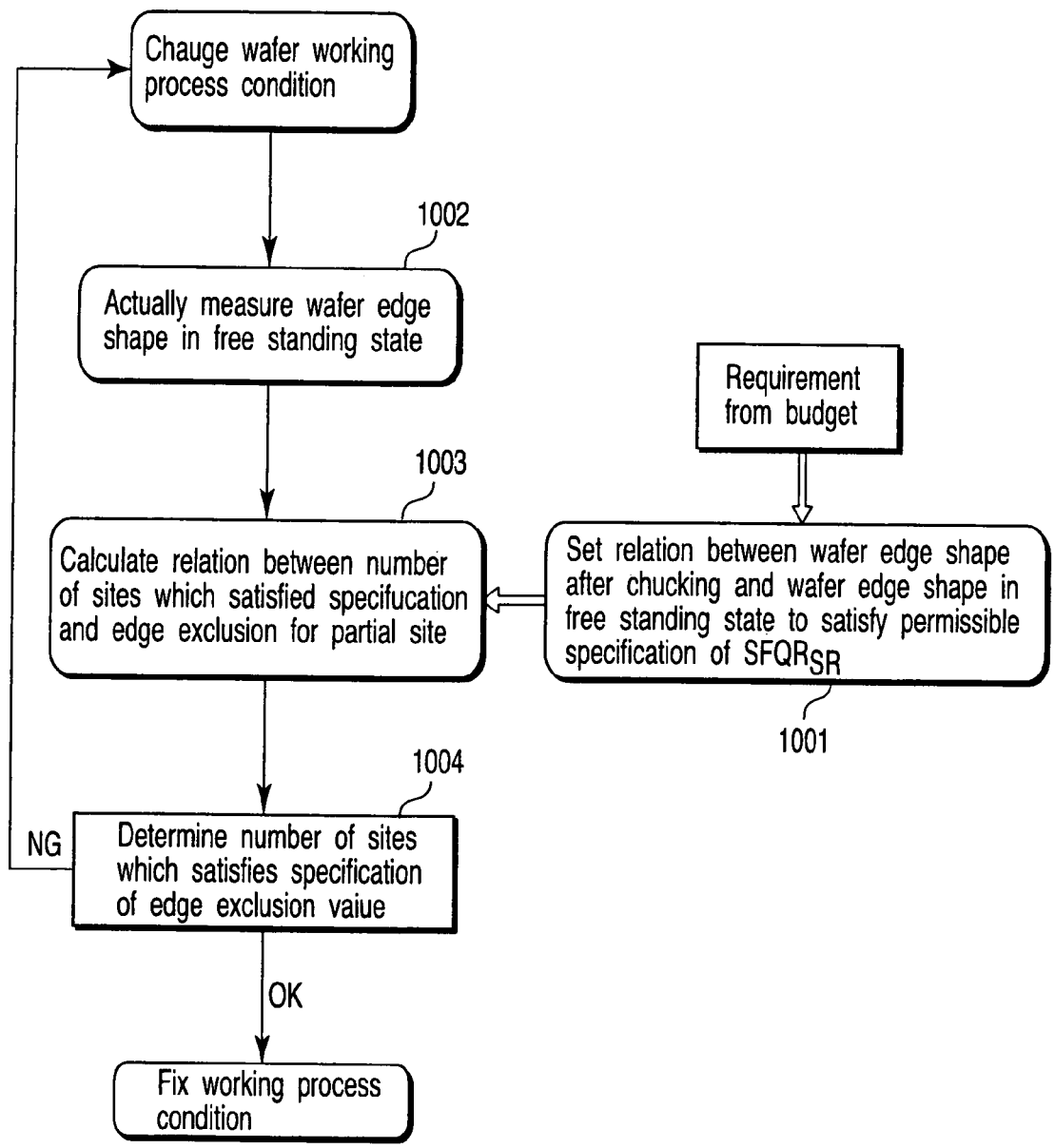
FIG. 28 is a flow diagram showing a second example of the wafer manufacturing method according to the sixth embodiment of this invention.

For example, as shown in FIG. 28, the above wafer manufacturing method can be performed according to the second embodiment or according to the third or fourth embodiments. That is, the same advantage as that in the above wafer manufacturing method can be attained by acquiring flatness evaluation information by use of at least one of the flatness evaluation methods according to the second to fourth embodiments and feeding back the thus acquired evaluation information to each working step of the wafer manufacturing process.

The above wafer manufacturing method is one example of a method for forming wafers with mirror surfaces on one side/both sides. However, the wafer manufactured by the above wafer manufacturing method is not limited to the wafer with the mirror surface on one side/both sides. As an example of the manufactured wafer, for example, an anneal wafer obtained by subjecting a mirror-surface wafer 2901 to the heat treatment (FIG. 29A), an epitaxial wafer obtained by forming an epitaxial layer 2903 on a mirror-surface wafer 2901 (FIG. 29B), or an SOI wafer obtained by sequentially forming an insulating layer 2904 and SOI layer 2905 on a supporting substrate, for example, mirror-surface wafer 2901 (FIG. 29C) can be given. Various types of anneal wafers are provided and, as shown in FIG. 29A, for example, a wafer having DZ (denuded zone) layers 2902 formed thereon by the heat treatment or a diffusion wafer having dopant diffused therein by the heat treatment can be given. Further, various types of SOI wafers are provided and an adhesive SOI wafer having two laminated wafers can be given.

Of course, it is possible to apply the wafer flatness evaluation method of this invention to wafers other than the wafers shown here as an example and the wafers can be formed by use of the evaluation method.

Seventh Embodiment

As the seventh embodiment, a wafer quality assurance method using a wafer flatness evaluation method according to this invention is explained.

Generally, only an assurance SFQR value relating to flatness, for example, is shown on a quality assurance sheet which specifically shows the wafer quality.

On the other hand, according to the wafer flatness evaluation method of the above embodiments, the flatness is evaluated for, for example, a site which is overhung from the stage or a site which lies in a peculiar position on the wafer stage among the sites of the wafer while the wafer is actually mounted on the wafer holder or imaginarily mounted on the wafer holder. The amount of overhanging of the wafer from the stage depends on the wafer stage diameter. The wafer stage diameter is different for each type of wafer holder. The position of the peculiar portion of the wafer stage is also different for each type of wafer holder. That is, the real flatness of the site which the exposure device senses is different for each type of wafer holder. If the wafer flatness evaluation process is performed for each type of wafer holder, the flatness evaluation process can be performed with higher precision.

FIG. 30 is a view showing one example of a quality assurance sheet obtained by the wafer quality assurance method according to the seventh embodiment of this invention.

As shown in FIG. 30, assurance SFQR values (AAA, ZZZ and the like) obtained after chucking in cases where the edge exclusion area is set to 3 mm, 2 mm and 1 mm are specifically indicated on the sheet for respective types of holders (such as a holder A, holder B, . . . , holder Y, holder Z). A wafer purchaser may detect a type of holder based on the sheet and recognize the assurance SFQR value specifically indicated on the column of the type of holder as the flatness of the wafer purchased.

Thus, the flatness in the wafer surface set closer to the real flatness which the exposure device senses can be assured by assuring the wafer quality, for example, the flatness in the wafer surface for each type of wafer holder. A purchaser of wafers in which the flatness is assured for each type of wafer holder can attain an advantage that fine semiconductor integrated circuit devices, for example, semiconductor integrated circuit devices of 100 nm-generation can be manufactured with high manufacturing yield.

Eighth Embodiment

The wafer flatness evaluation methods explained in the first to fourth embodiments can be similarly applied to a semiconductor device manufacturing method.

Figure 31:
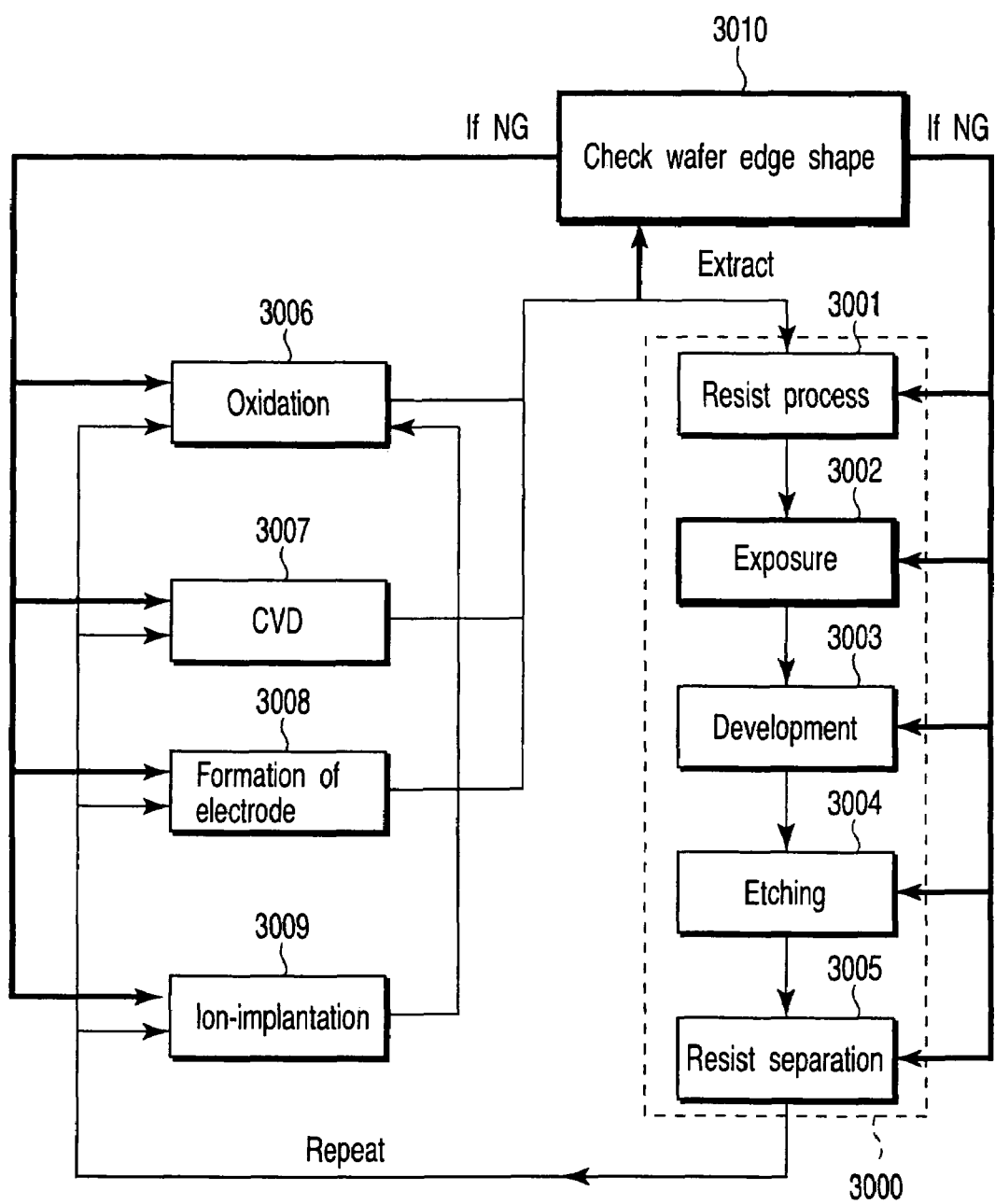
FIG. 31 is a flow diagram showing a semiconductor device manufacturing method according to an eighth embodiment of this invention.

FIG. 31 is a flow diagram showing a semiconductor device manufacturing method according to the eighth embodiment.

As shown in FIG. 31, for example, working steps such as an oxidation step 3006, CVD step 3007, electrode forming (for example, sputtering) step 3008, ion-implantation step 3009 are performed prior to a lithography process 3000. A semiconductor device is manufactured by sequentially and repeatedly performing one of the working steps 3006 to 3009 and the photolithography process 3000. The photolithography process 3000 starts from a resist processing (resist coating, baking) step 3002 and an exposure step 3002 is performed after a mask aligning step is performed. Then, an exposed resist is developed in a development step 3003 and a ground layer is etched while a resist pattern obtained in the development step is used as a mask in an etching step 3004 (for example, the step is omitted in some cases if the next step is an ion-implantation step 3009). Finally, the lithography process 3000 is terminated by separating the resist in a resist separation step 3005.

As explained in the above embodiment, if the wafer flatness is evaluated while it is set closer to the real flatness which the exposure device senses, it is useful to enhance the manufacturing yield of semi-conductor devices. From the similar viewpoint, if the flatness of the ground layer which is being evaluated while it is closer to the real flatness which the exposure device senses, it is useful to enhance the yield of the semiconductor devices.

Therefore, as in the present example, a wafer which is being worked is extracted after the working steps 3006 to 3009 and before the lithography process 3000 and a wafer edge shape checking step 3010 is performed for the extracted wafer, for example. In the shape checking step 3010, the shape of the wafer edge is checked and the flatness evaluation process explained in the second embodiment with reference to FIG. 5 is performed, for example. In the evaluation process, information as to whether the flatness of a wafer which is being worked, for example, the flatness of a ground layer which is being worked keeps a value which satisfies the requirement of the budget or keeps a value which exceeds the budget requirement but causes no problem in the actual manufacturing process can be acquired. If the flatness of the ground layer which is being worked keeps a satisfactory value or keeps a value which causes no problem in the actual manufacturing process, the working process condition of the working steps 3006 to 3009 and the working process condition of the lithography steps 3001 to 3005 are fixed. On the other hand, if the flatness of the ground layer which is being (worked keeps neither a satisfactory value nor a value which causes no problem in the actual manufacturing process, the working process condition of at least one of the working steps 3006 to 3009 and lithography steps 3001 to 3005 is changed. Thus, the working process condition is optimized to keep a satisfactory value or a value which causes no problem in the actual manufacturing process.

In this example, the flatness evaluation method according to the second embodiment is applied to the semiconductor device manufacturing process, but the flatness evaluation method according to each of the first, third and fourth embodiments can be applied to the semiconductor device manufacturing process.

Thus, if the wafer flatness evaluation method explained in the first to fourth embodiments is applied to the semiconductor device manufacturing method, the manufacturing yield of semiconductor devices can be further enhanced.

This invention has been explained with reference to the first to eighth embodiments, but this invention is not limited to the above embodiments and can be variously modified without departing from the technical scope thereof when embodying the invention.

Further, the above embodiments can be independently performed, but they can be adequately combined and performed. The above embodiments are examples and have substantially the same configuration as the technical idea described in claims of the invention. Any type of embodiment which provides the same operation and effect can be contained in the technical scope of the present invention.

Inventions of various stages are contained in the above embodiments and the inventions of various stages can be extracted by adequately combining a plurality of constituents disclosed in the above embodiments.

As described above, according to the above embodiments, a wafer flatness evaluation method capable of evaluating the flatness in a wafer surface while it is set closer to the flatness which the exposure device senses, a wafer flatness evaluation apparatus which carries out the evaluation method, a wafer manufacturing method using the evaluation method, a wafer quality assurance method using the evaluation method, a semiconductor device manufacturing method using the evaluation method, and a semiconductor device manufacturing method using a wafer evaluated by the evaluation method.

Additional advantages and modifications will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A wafer flatness evaluation method comprising:
measuring a thickness variation of a wafer in a free standing state;
deriving local flatness on a reference of a wafer rear surface on the assumption that the wafer rear surface is corrected to a flat plane based on the result of the measurement;
deriving a flatness transfer constant corresponding to magnitude of the local flatness on the reference of the wafer rear surface; and
calculating local flatness of the wafer front surface at the wafer holder chucking time based on a value of the flatness transfer constant and the local flatness on the reference of the wafer rear surface.

2. A wafer flatness evaluation method comprising:
measuring a thickness variation of a wafer in a free standing state;
deriving local flatness on a reference of a wafer rear surface on the assumption that the wafer rear surface is corrected to a flat plane based on the result of the measurement;
dealing with the local flatness on the reference of the wafer rear surface as a final result when magnitude of the local flatness on the reference of the wafer rear surface does not exceed a preset value and doing a simulation for chucking the wafer on a wafer holder when the magnitude of the local flatness on the reference of the wafer rear surface exceeds the preset value; and
calculating local flatness of the wafer front surface when the wafer is chucked on the wafer holder based on the result of simulation.

3. A wafer flatness evaluation method comprising:
measuring a thickness variation of a wafer in a free standing state;
deriving local flatness on a reference of a wafer rear surface on the assumption that the wafer rear surface is corrected to a flat plane based on the result of the measurement;
dealing with the local flatness on the reference of the wafer rear surface as a final result when magnitude of the local flatness on the reference of the wafer rear surface does not exceed a preset value and chucking the wafer on a wafer holder when the magnitude of the local flatness on the reference of the wafer rear surface exceeds the preset value; and
calculating local flatness based on the wafer front surface shape in the chucking state.

4. A wafer flatness evaluation apparatus comprising:
a measuring section which measures a thickness variation of a wafer in a free standing state;
a local flatness acquiring section which acquires local flatness on a reference of a wafer rear surface on the assumption that the rear surface of the wafer is corrected to a flat plane based on the result of the measurement;
a flatness transfer constant acquiring section which acquires a flatness transfer constant corresponding to magnitude of the local flatness on the reference of the wafer rear surface; and
a calculating section which calculates local flatness of the wafer front surface at the time of chucking on the wafer holder based on a value of the flatness transfer constant and the local flatness on the reference of the wafer rear surface.

5. A wafer flatness evaluation apparatus comprising:
a measuring section which measures a thickness variation of a wafer in a free standing state;
a local flatness acquiring section which acquires local flatness on a reference of a wafer rear surface on the assumption that the rear surface of the wafer is corrected to a flat plane based on the result of the measurement;
a simulation performing section which deals with the local flatness on the reference of the wafer rear surface as a final result when magnitude of the local flatness on the reference of the wafer rear surface does not exceed a preset value and performs a simulation for chucking the wafer on a wafer holder when the magnitude of the local flatness on the reference of the wafer rear surface exceeds the preset value; and
a calculating section which calculates local flatness of the wafer front surface when the wafer is chucked on the wafer holder based on the result of simulation.

6. A wafer flatness evaluation apparatus comprising:
a measuring section which measures a thickness variation of a wafer in a free standing state;
a local flatness acquiring section which acquires local flatness on a reference of a wafer rear surface on the assumption that the rear surface of the wafer is corrected to a flat plane based on the result of the measurement;
a chucking section which deals with the local flatness on the reference of the wafer rear surface as a final result when magnitude of the local flatness on the reference of the wafer rear surface does not exceed a preset value and chucks the wafer on a wafer holder when the magnitude of the local flatness on the reference of the wafer rear surface exceeds the preset value; and
a calculating section which calculates local flatness based on the wafer front surface shape in the chucking state.

* * * * *